United States Patent
Lee et al.

(10) Patent No.: US 11,232,996 B2
(45) Date of Patent: Jan. 25, 2022

(54) SEMICONDUCTOR DEVICE PACKAGE COMPRISING THERMAL INTERFACE LAYER AND METHOD OF FABRICATING OF THE SAME

(71) Applicants: INDUSTRY-UNIVERSITY COOPERATION FOUNDATION HANYANG UNIVERSITY ERICA CAMPUS, Ansan-Si (KR); FOUNDATION FOR RESEARCH AND BUSINESS, SEOUL NATIONAL UNIVERSITY OF SCIENCE AND TECHNOLOGY, Seoul (KR)

(72) Inventors: Sunyong Lee, Ansan-si (KR); Sarah Eunkyung Kim, Seoul (KR); Tae Hyeob Im, Ansan-si (KR)

(73) Assignees: INDUSTRY-UNIVERSITY COOPERATION FOUNDATION HANYANG UNIVERSITY ERICA CAMPUS, Ansan-Si (KR); FOUNDATION FOR RESEARCH AND BUSINESS, SEOUL NATIONAL UNIVERSITY OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 16/904,685

(22) Filed: Jun. 18, 2020

(65) Prior Publication Data
US 2021/0118771 A1  Apr. 22, 2021

Related U.S. Application Data

(63) Continuation of application No. PCT/KR2019/018092, filed on Dec. 19, 2019.

(30) Foreign Application Priority Data

Oct. 18, 2019 (KR) .................. 10-2019-0129518

(51) Int. Cl.
*H01L 23/373* (2006.01)
*H01L 21/48* (2006.01)
(Continued)

(52) U.S. Cl.
CPC ...... *H01L 23/3736* (2013.01); *H01L 21/4882* (2013.01); *H01L 23/42* (2013.01); *H01L 24/83* (2013.01)

(58) Field of Classification Search
CPC ............ H01L 23/3736; H01L 21/4882; H01L 23/3735; H01L 23/3737; H01L 23/373; H01L 23/42; H01L 24/83
See application file for complete search history.

(56) References Cited

U.S. PATENT DOCUMENTS 9,175,385 B2  11/2015  Kim et al.
9,336,922 B2  5/2016  Kim et al.
(Continued)

FOREIGN PATENT DOCUMENTS

JP  2017-113934 A  6/2017
KR  10-2011-0041214 A  4/2011
(Continued)

OTHER PUBLICATIONS

Wang et al., "Synthesis, growth mechanism and thermal stability of copper nanoparticles encapsulated by multi-layer graphene", Carbon 50, pp. 2119-2125 (2012).
(Continued)

*Primary Examiner* — Patricia D Valenzuela
(74) *Attorney, Agent, or Firm* — Finch & Maloney PLLC

(57) ABSTRACT

A method for manufacturing a semiconductor device package may comprise providing a semiconductor device, pre-
(Continued)

paring a thermal interface layer on the semiconductor device, and disposing a heat spreader on the thermal interface layer, wherein the thermal interface layer comprises a core shell composite containing a metal core and a carbon shell surrounding the metal core.

12 Claims, 26 Drawing Sheets

(51) Int. Cl.
    *H01L 23/42*     (2006.01)
    *H01L 23/00*     (2006.01)

(56) References Cited

U.S. PATENT DOCUMENTS

| | | | |
|---|---|---|---|
| 9,716,299 B2 | 7/2017 | Balandin | |
| 10,121,717 B2 | 11/2018 | Sun et al. | |
| 2008/0213189 A1* | 9/2008 | Lee | A61K 47/6923 424/9.32 |
| 2013/0287948 A1* | 10/2013 | Kim | B22F 7/08 427/255.26 |
| 2014/0120399 A1* | 5/2014 | Balandin | H01M 10/653 429/120 |
| 2015/0054020 A1 | 2/2015 | Paolella et al. | |
| 2018/0154580 A1* | 6/2018 | Mark | B29C 64/35 |
| 2018/0323130 A1* | 11/2018 | Liu | C08L 83/00 |

FOREIGN PATENT DOCUMENTS

| | | |
|---|---|---|
| KR | 10-2013-0010848 A | 1/2013 |
| KR | 10-2013-0122102 | 11/2013 |
| KR | 10-2014-0053629 | 5/2014 |
| KR | 10-2014-0098353 A | 8/2014 |
| KR | 10-2016-0045723 | 4/2016 |
| KR | 10-2017-0035029 | 3/2017 |
| KR | 10-2017-0066282 | 6/2017 |
| KR | 10-2019-0060030 | 6/2019 |

OTHER PUBLICATIONS

International Search Report for International Application No. PCT/KR2019/018092 dated Jul. 14, 2020, 2 pages.
Written Opinion for International Application No. PCT/KR2019/018092 dated Jul. 14, 2020, 8 pages.

\* cited by examiner

[Fig. 1]
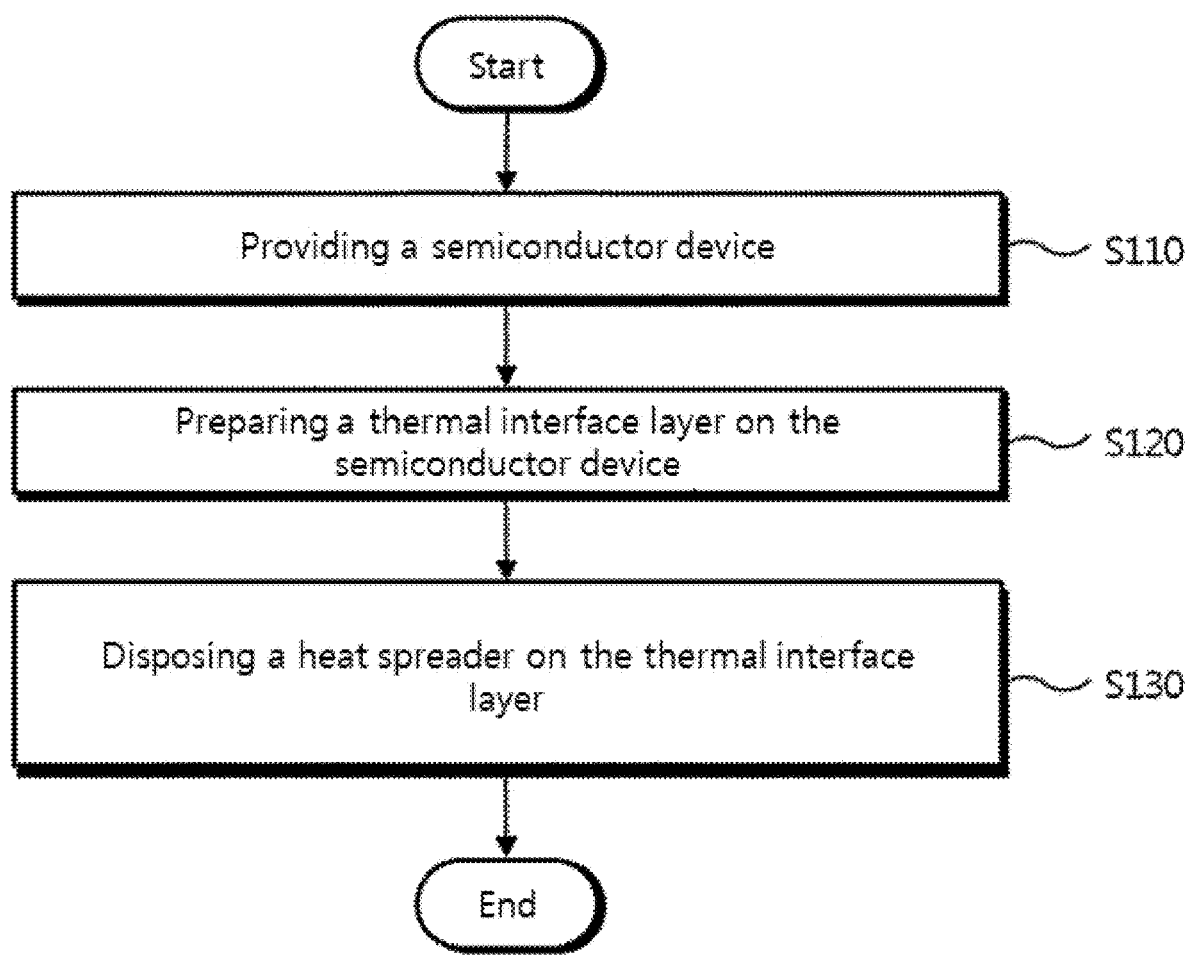

[Fig. 2]
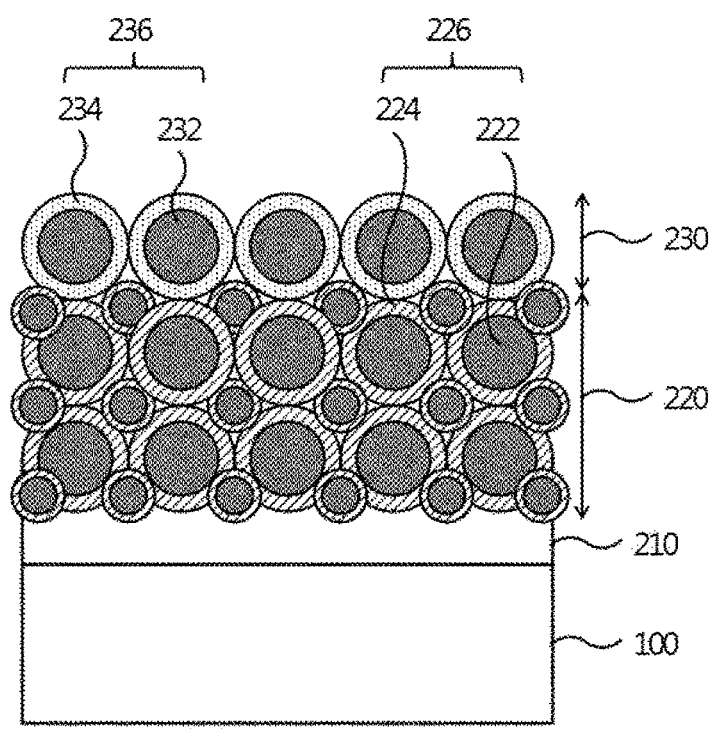

[Fig. 3]
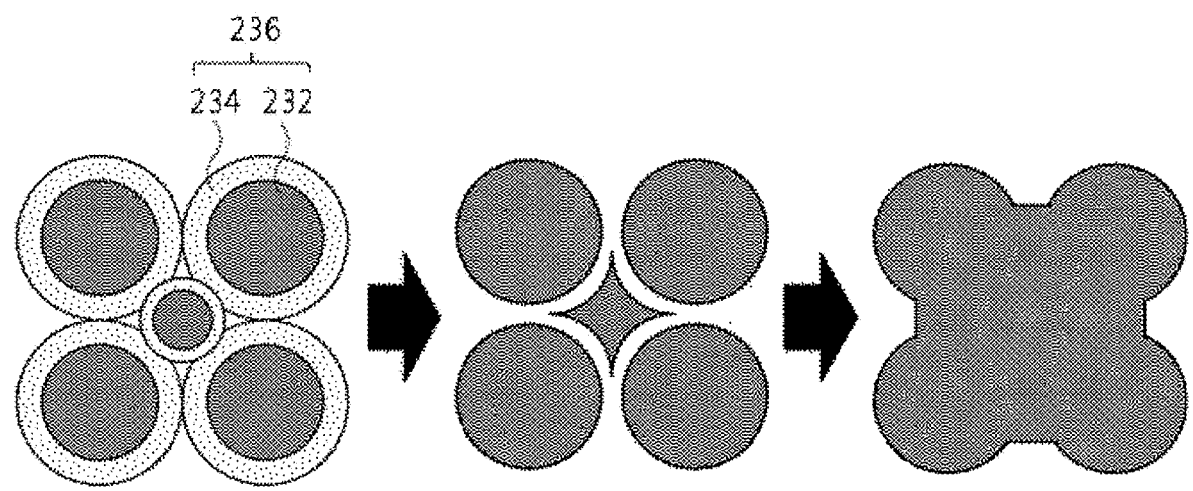

[Fig. 4]
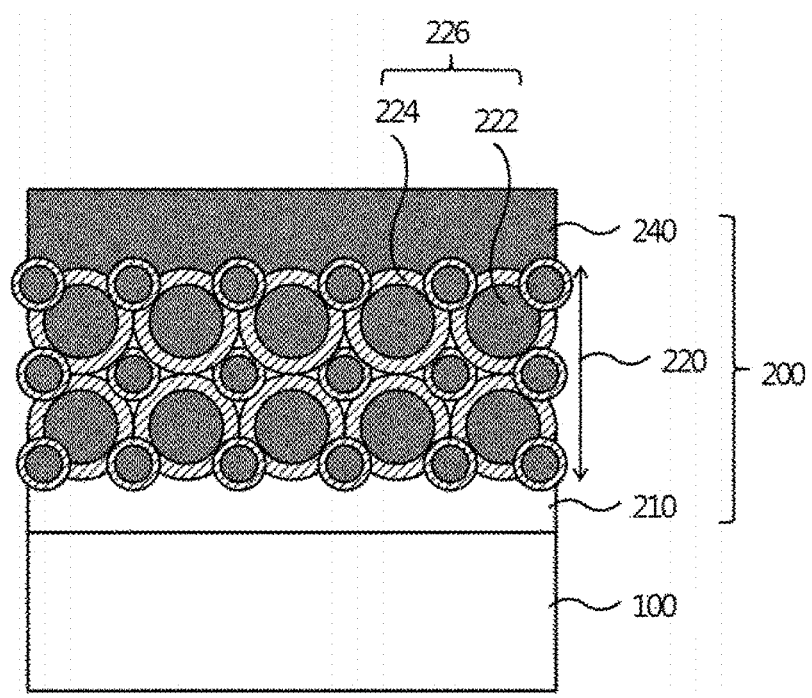

[Fig. 5]
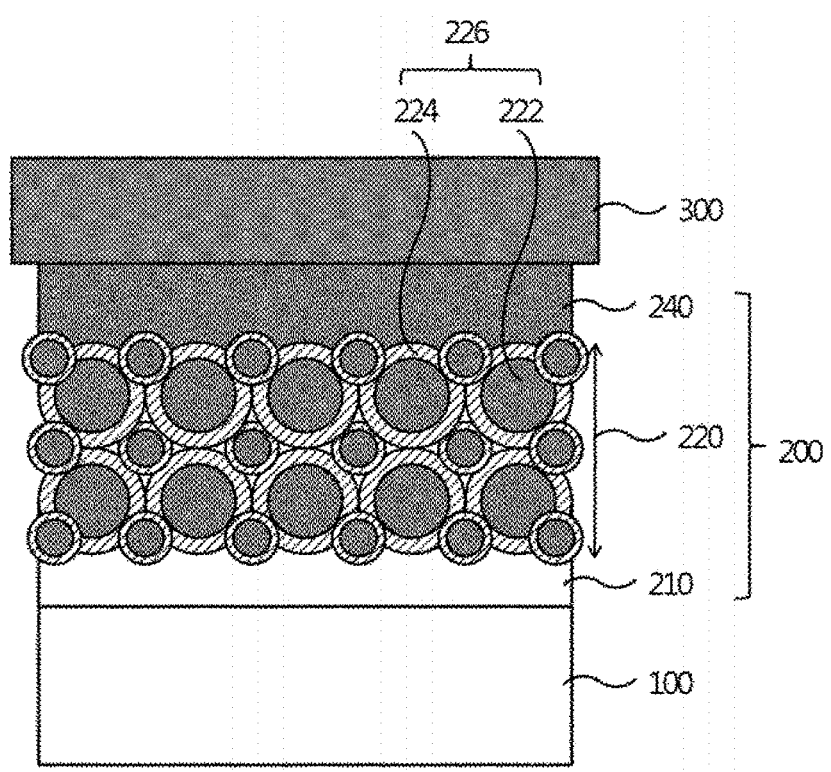

[Fig. 6]
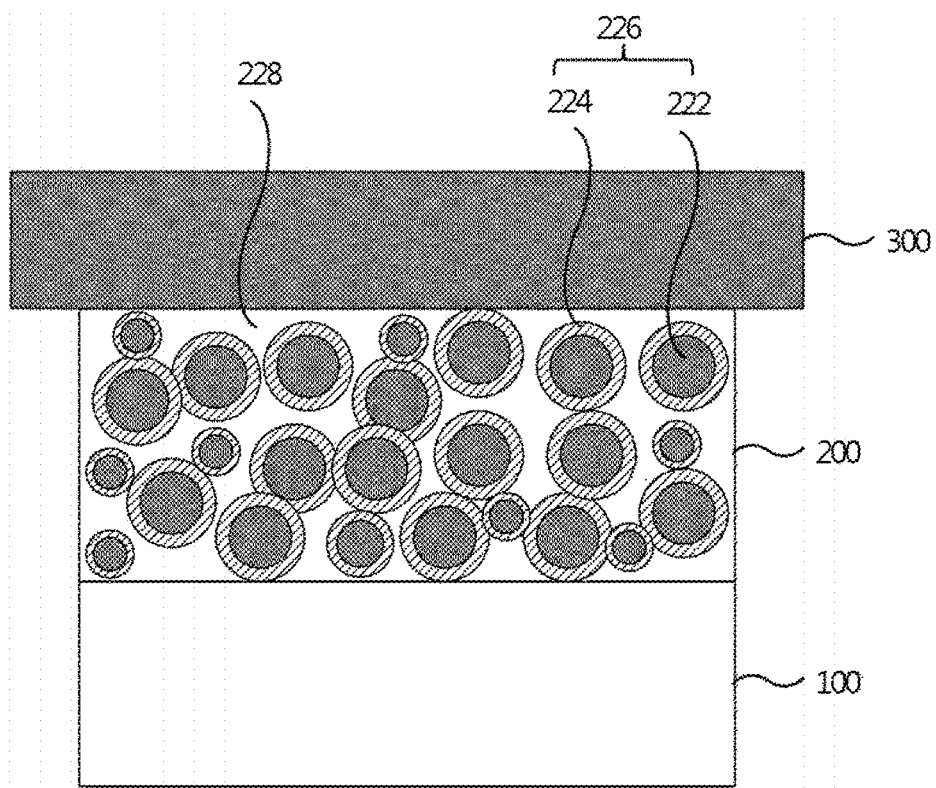

[Fig. 7]
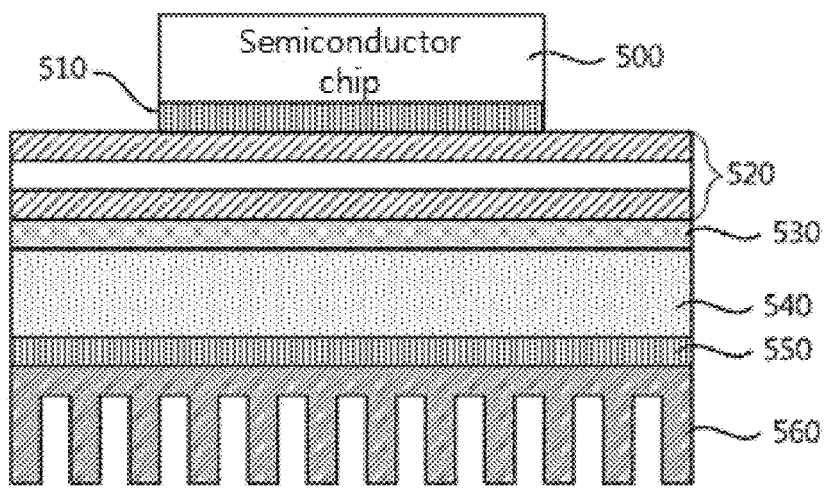

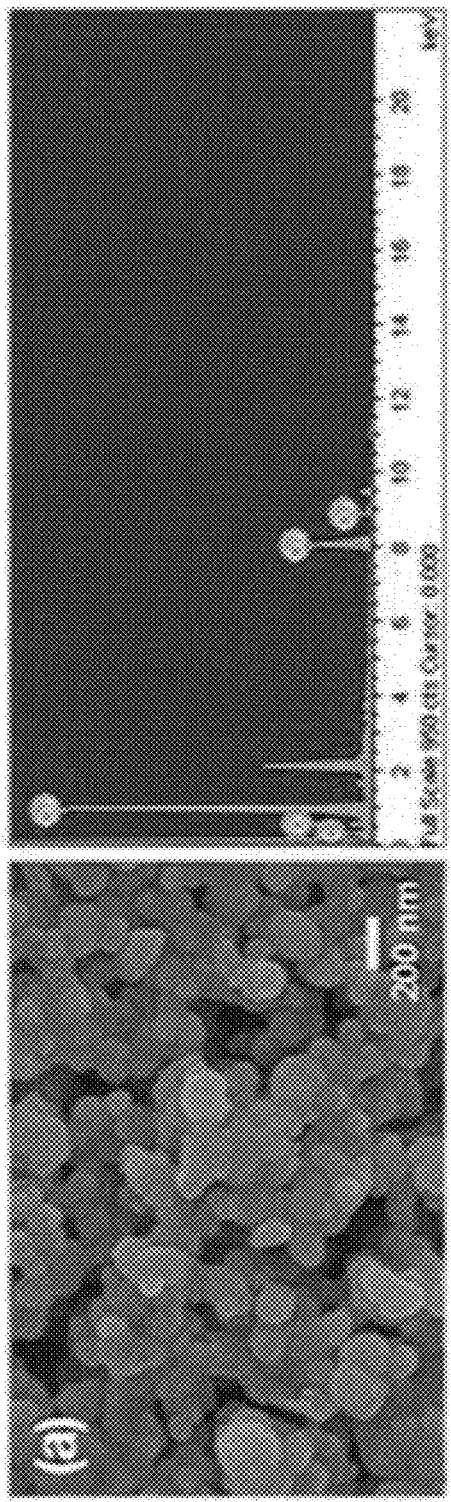
[Fig. 8]

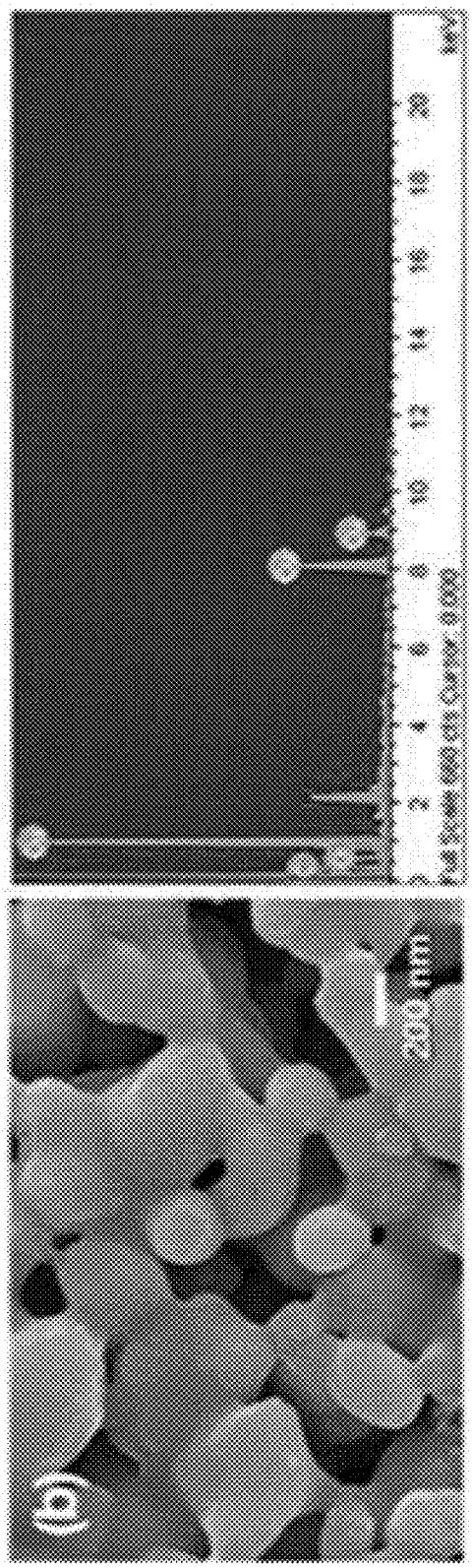
[Fig. 9]

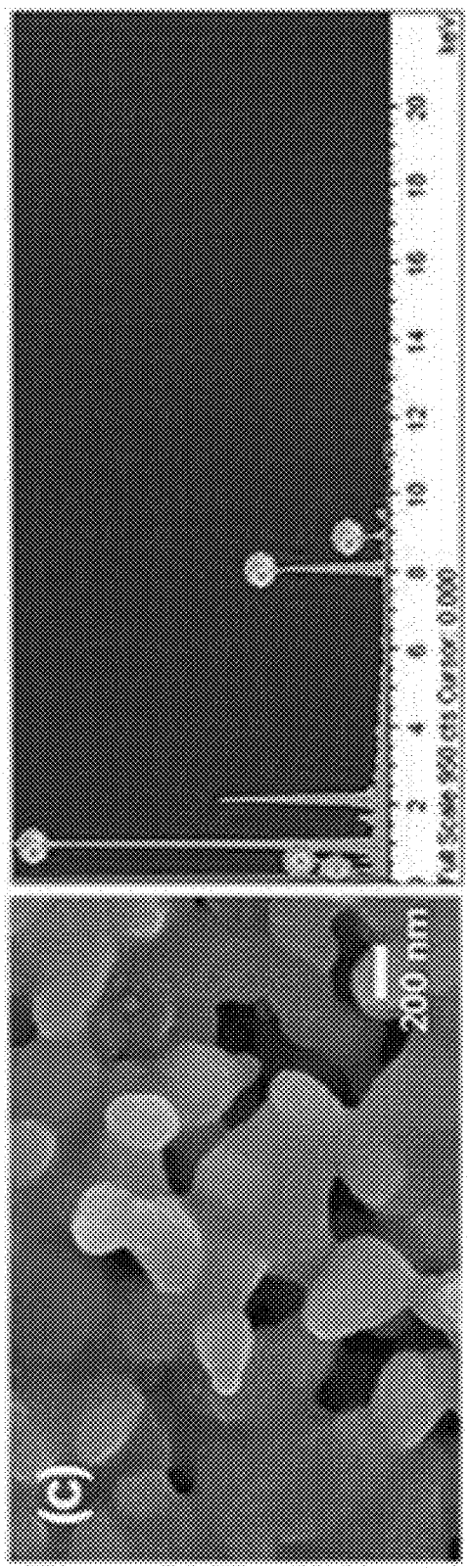
[Fig. 10]

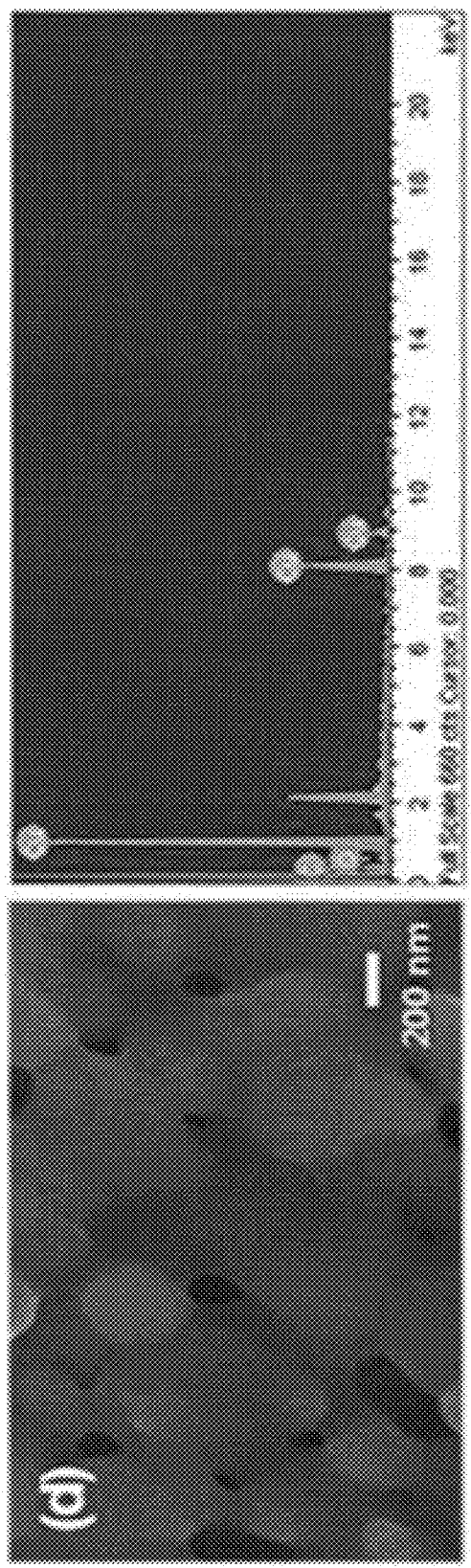
[Fig. 11]

[Fig. 12]
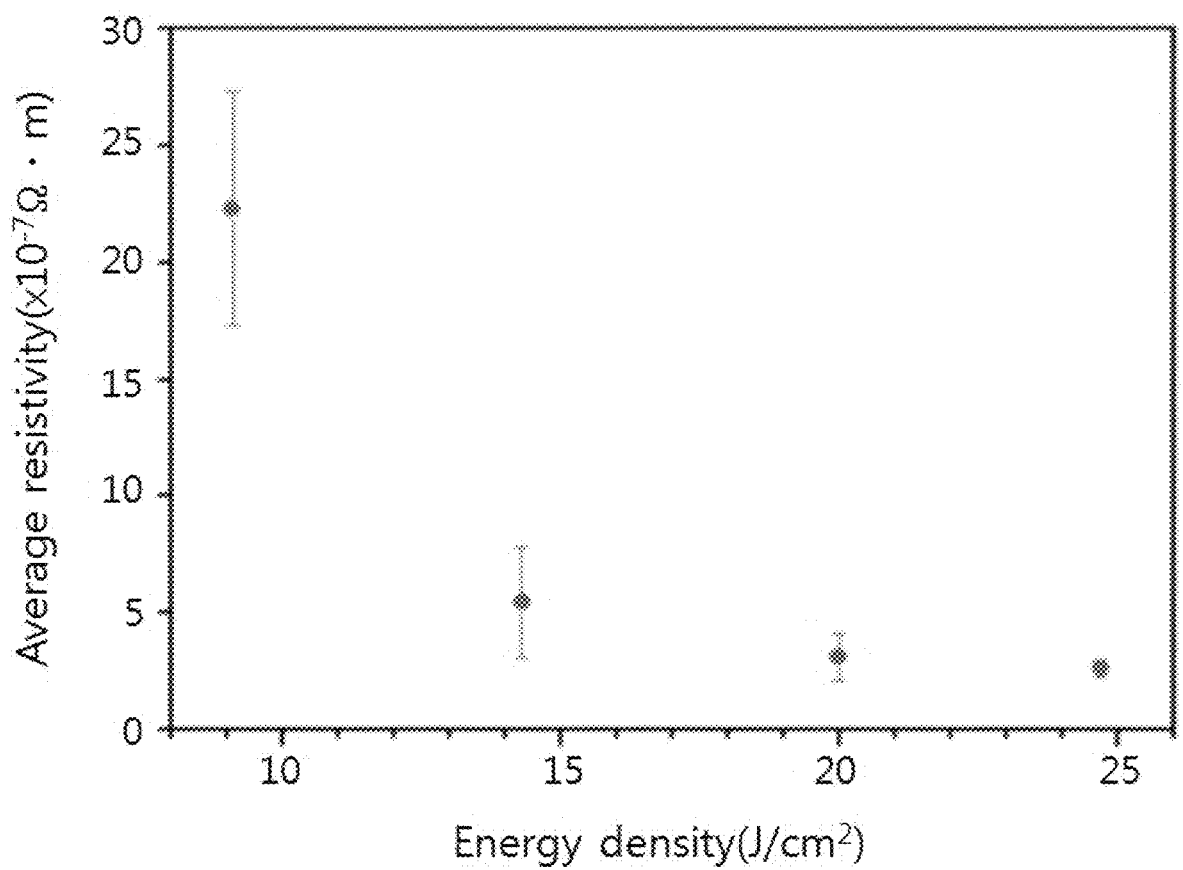

[Fig. 13]
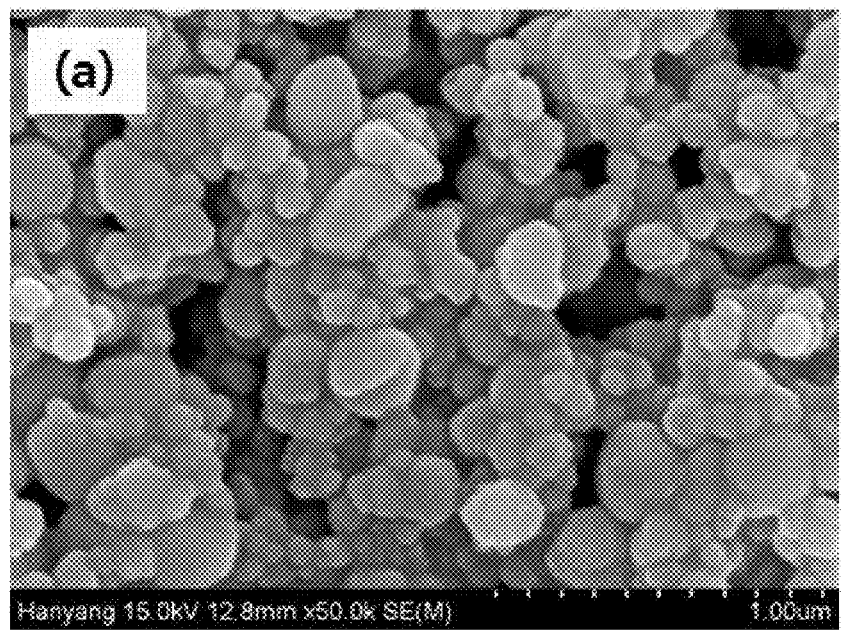
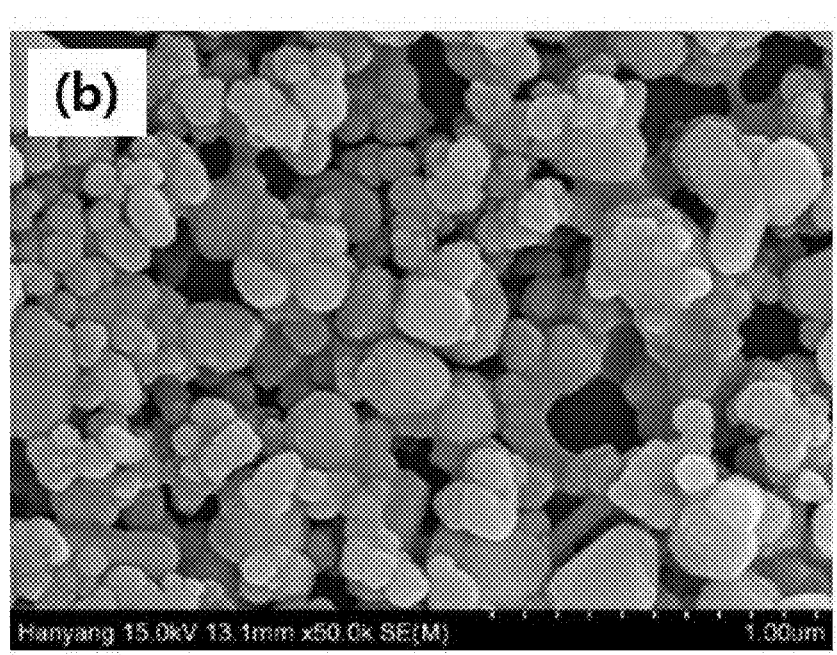

[Fig. 14]
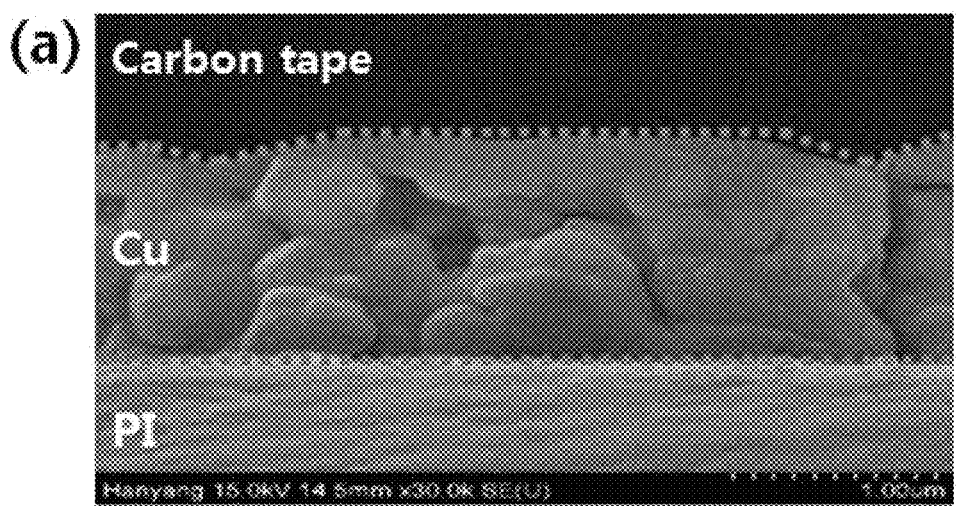
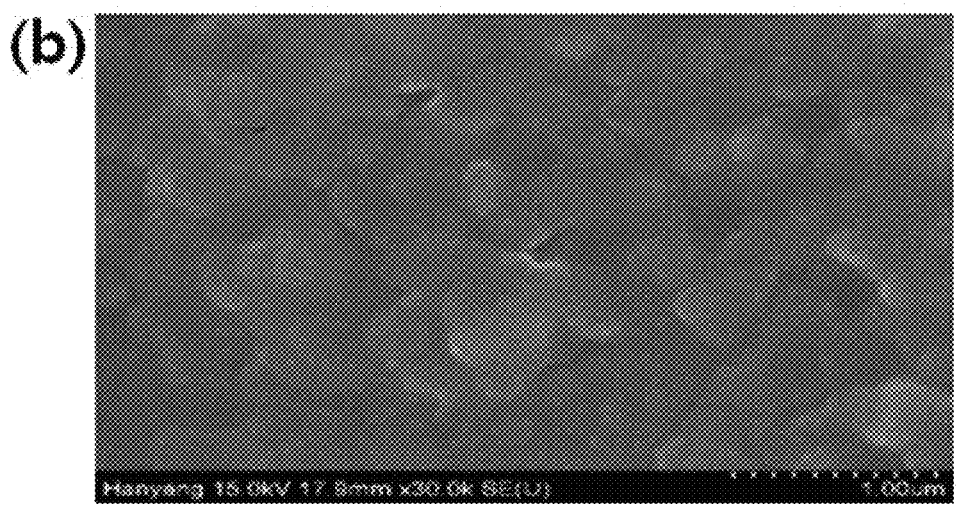

[Fig. 15]
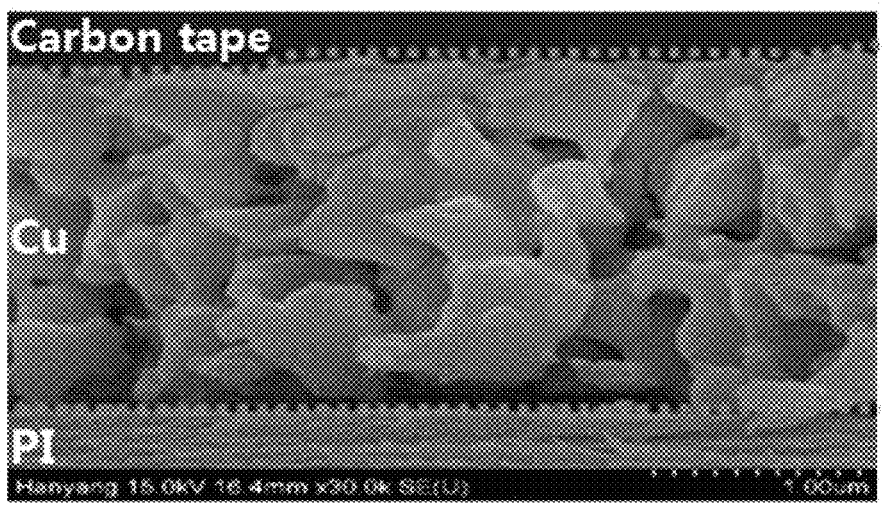
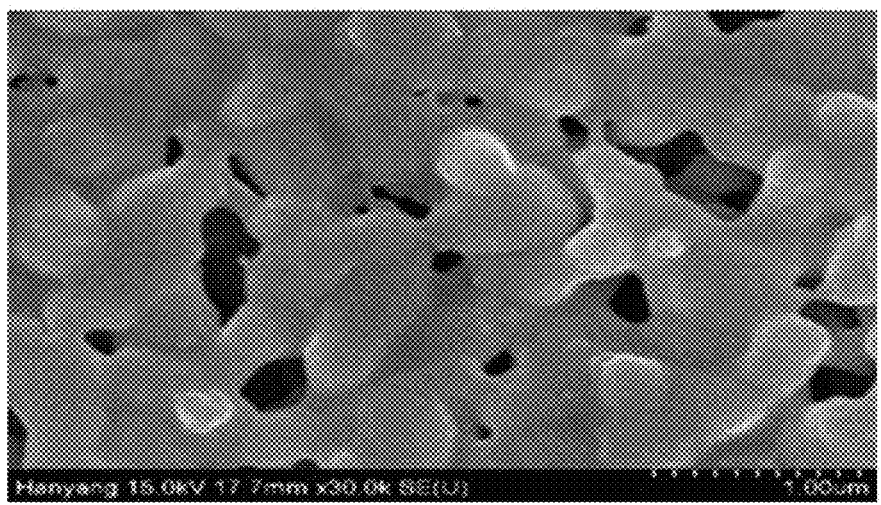

[Fig. 16]
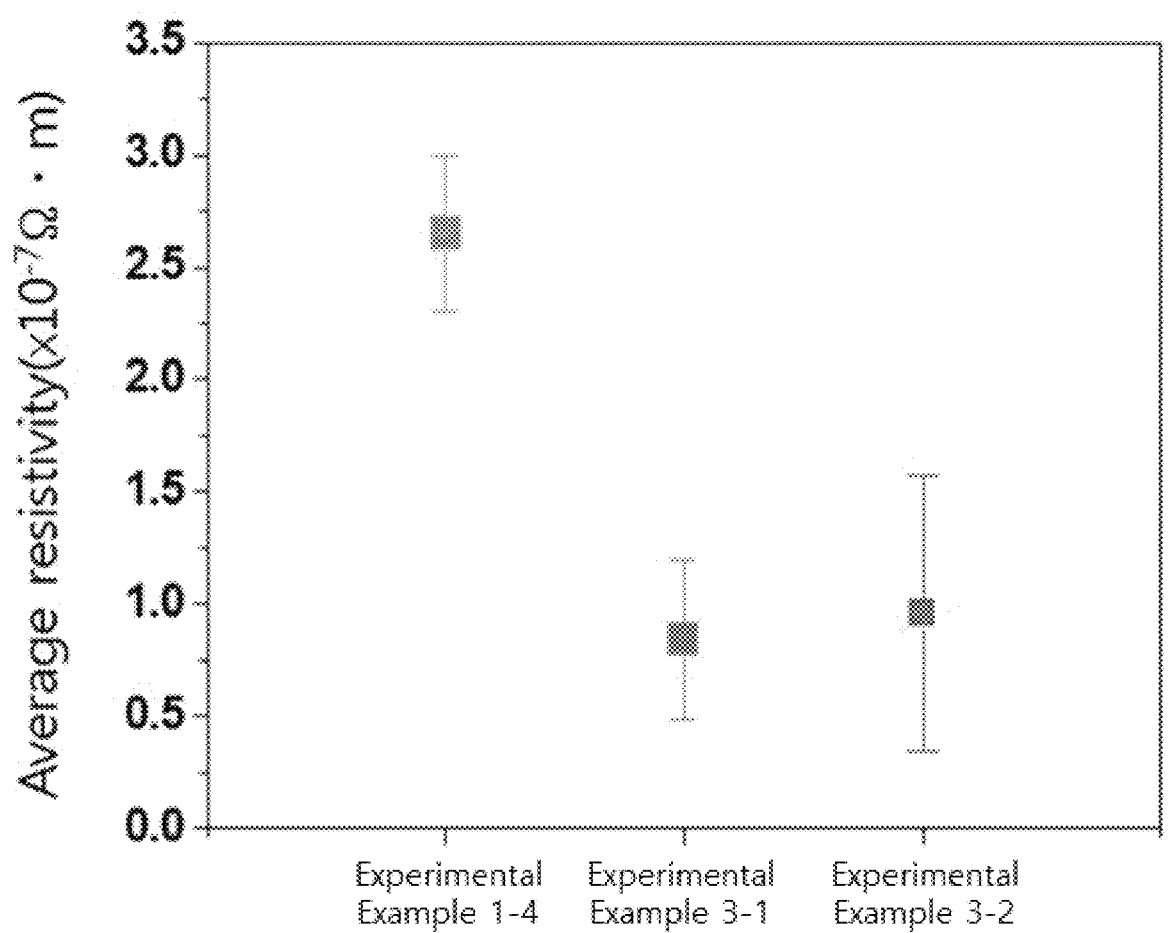

[Fig. 17]
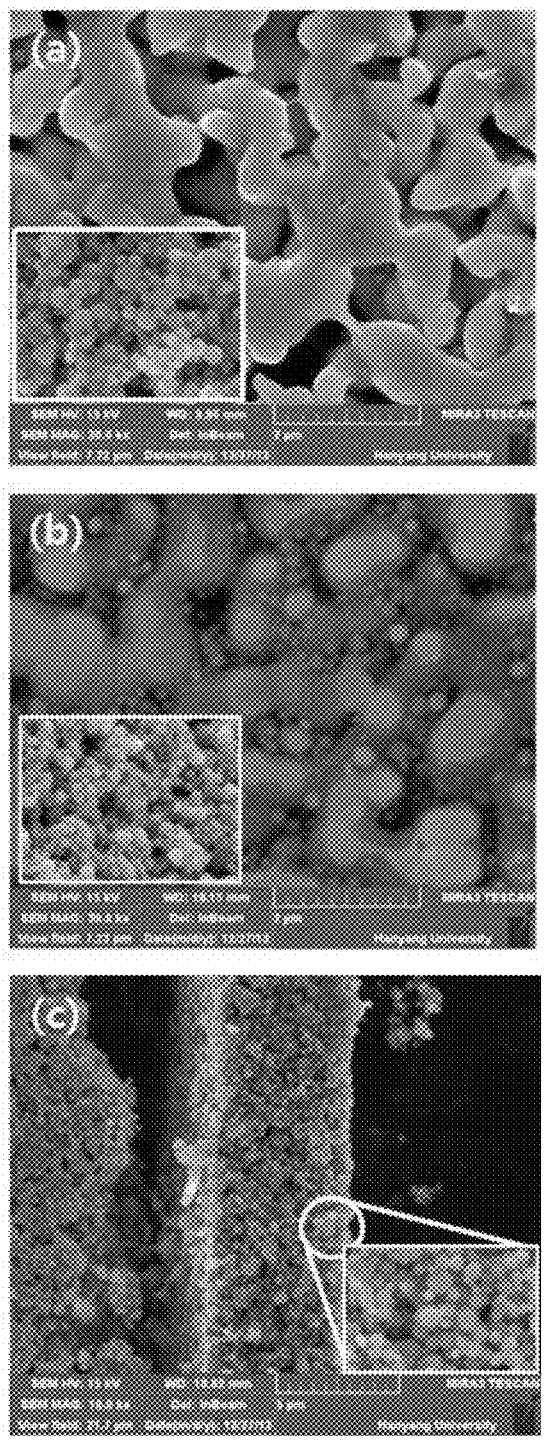

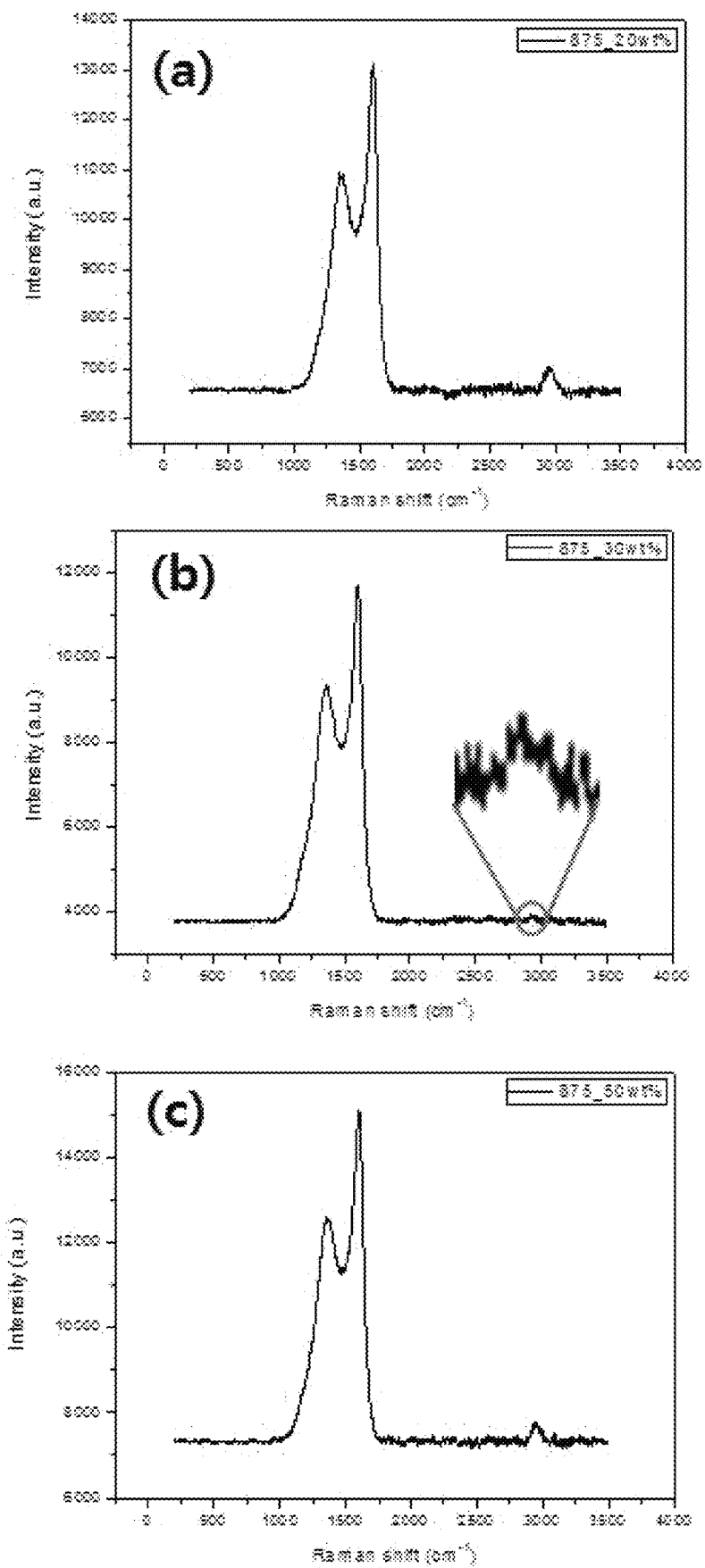
[Fig. 18]

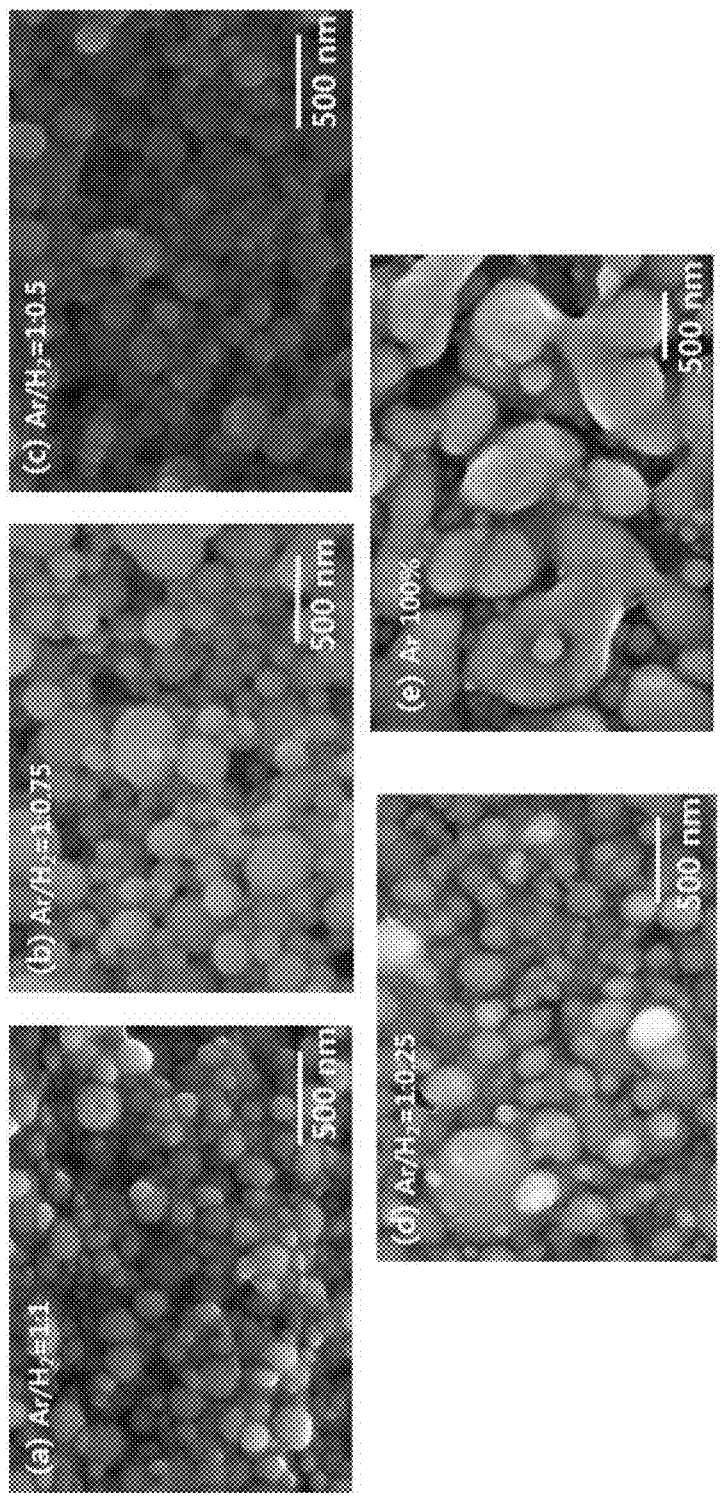
[Fig. 19]

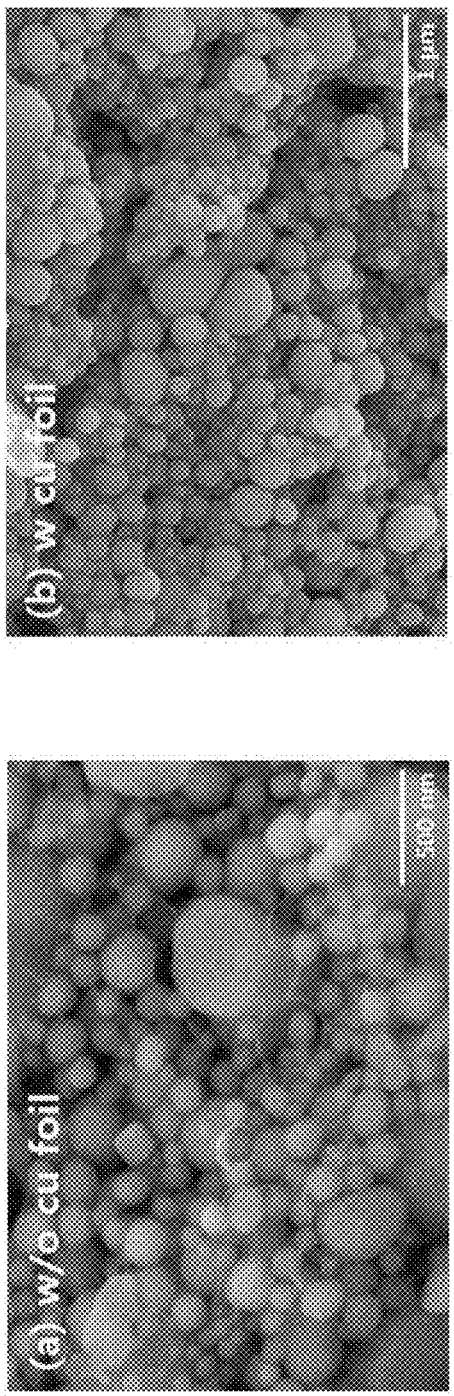
[Fig. 20]

[Fig. 21]
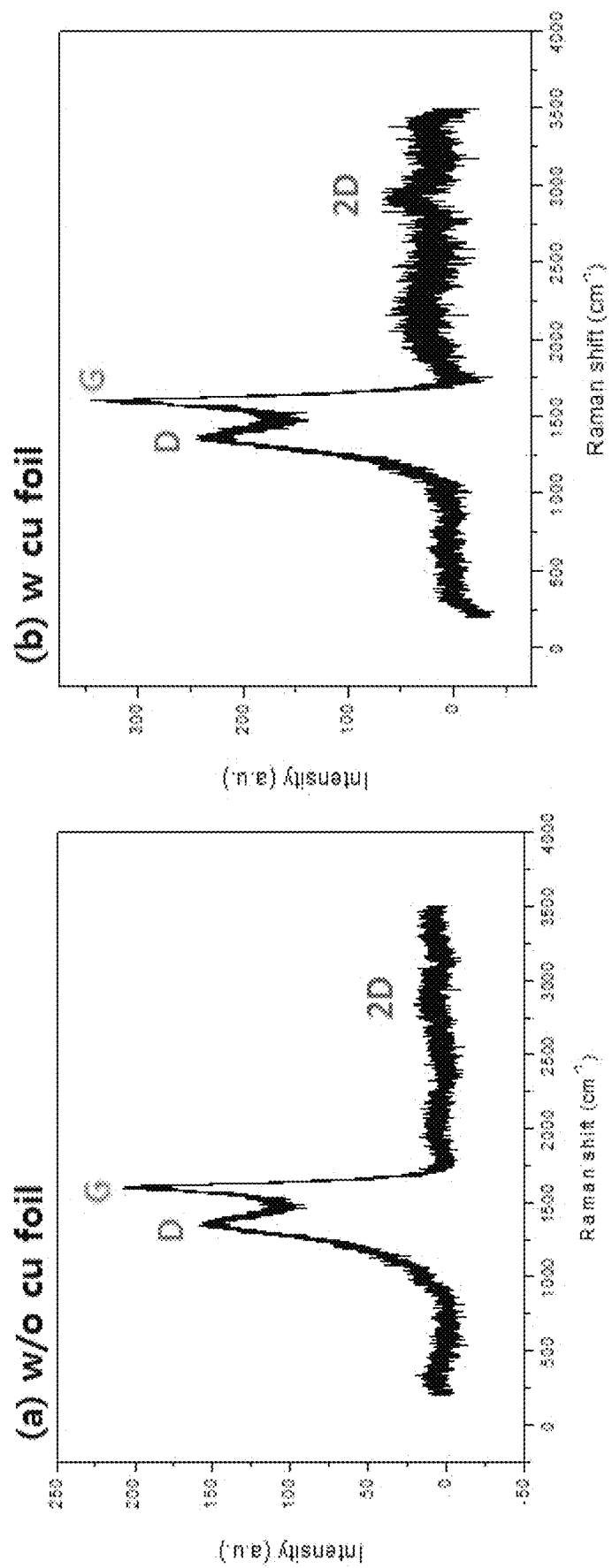

[Fig. 22]
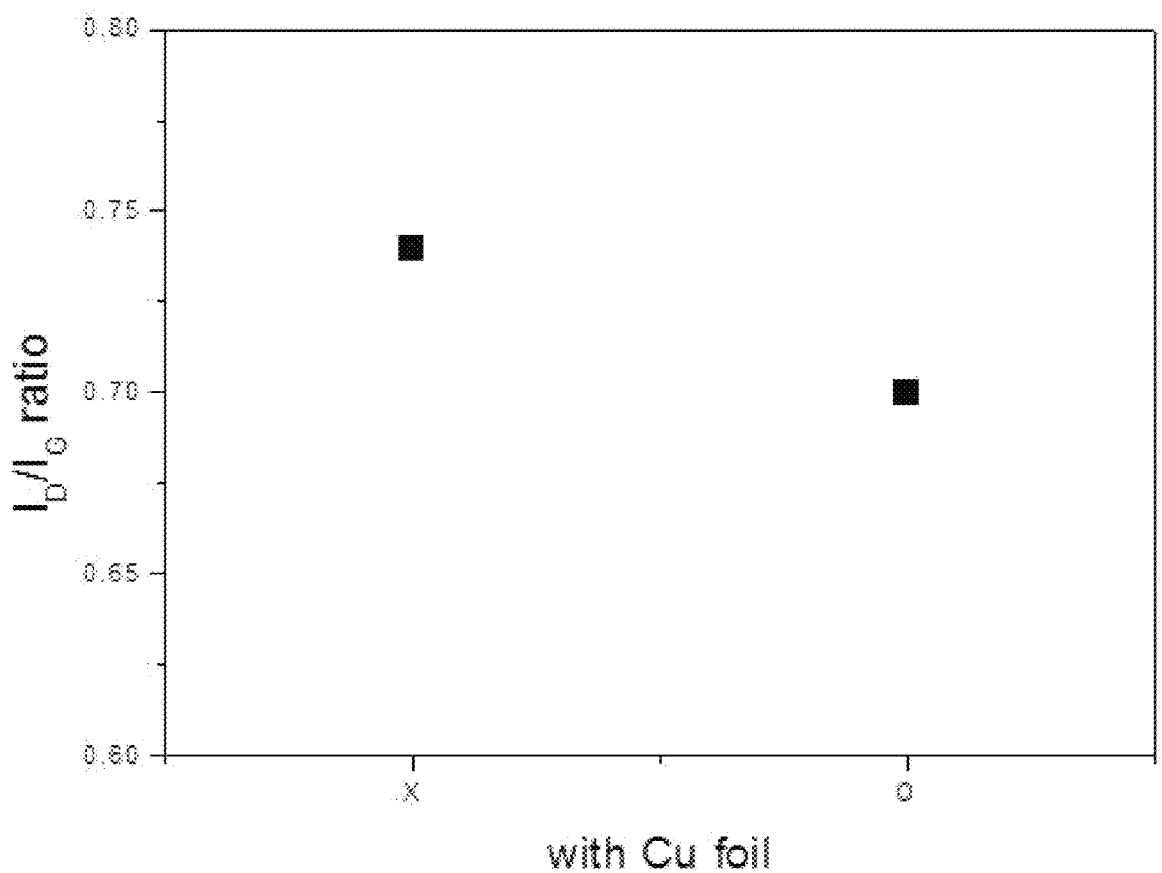

[Fig. 23]
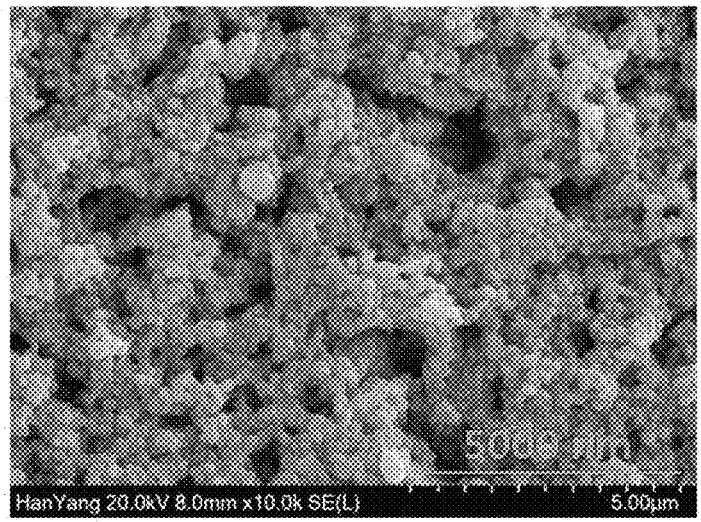
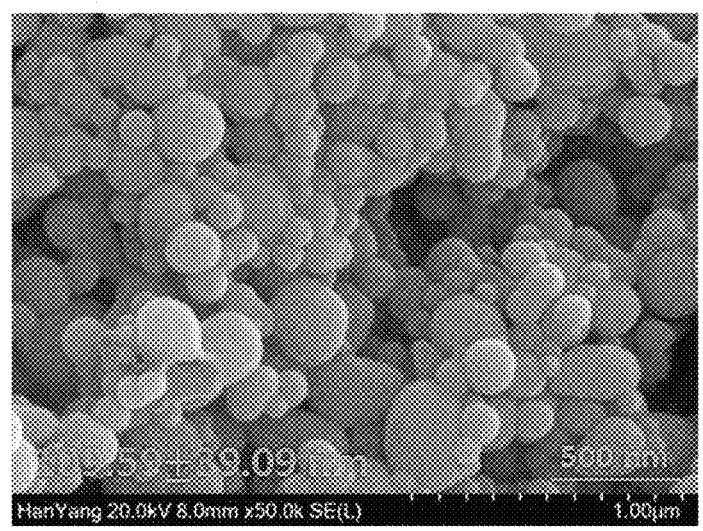
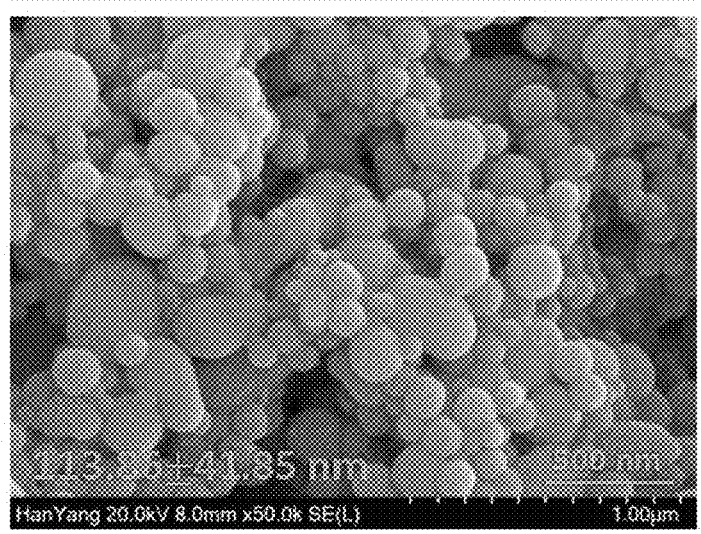

[Fig. 24]
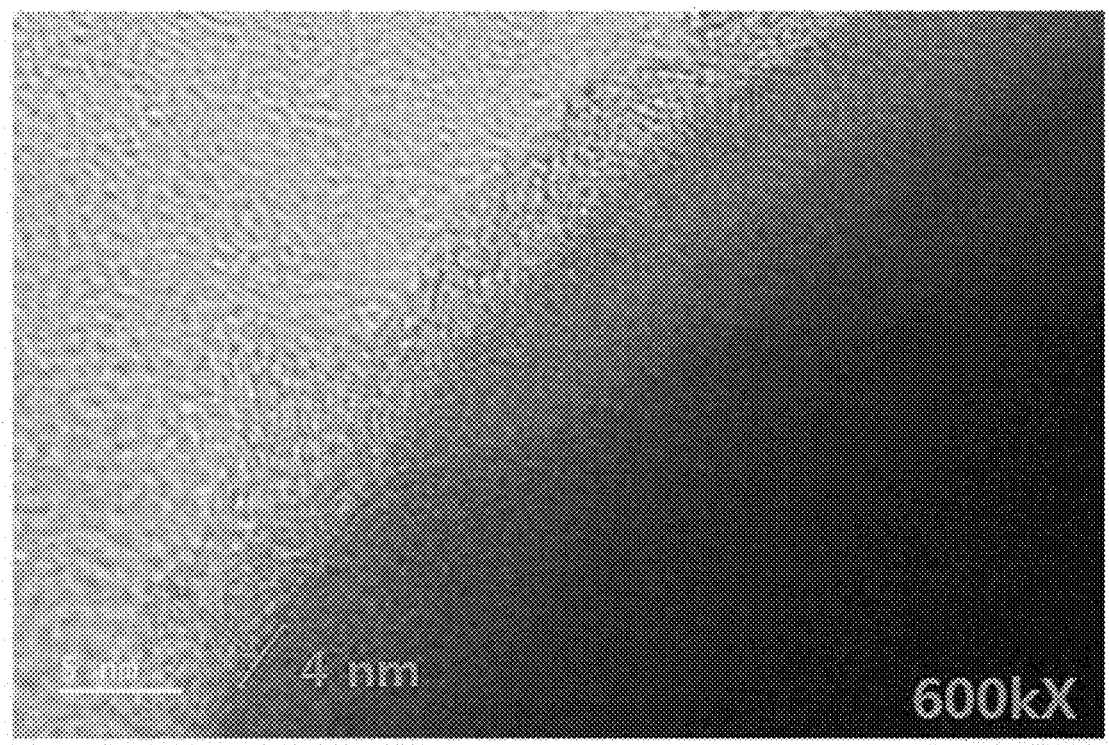

[Fig. 25]
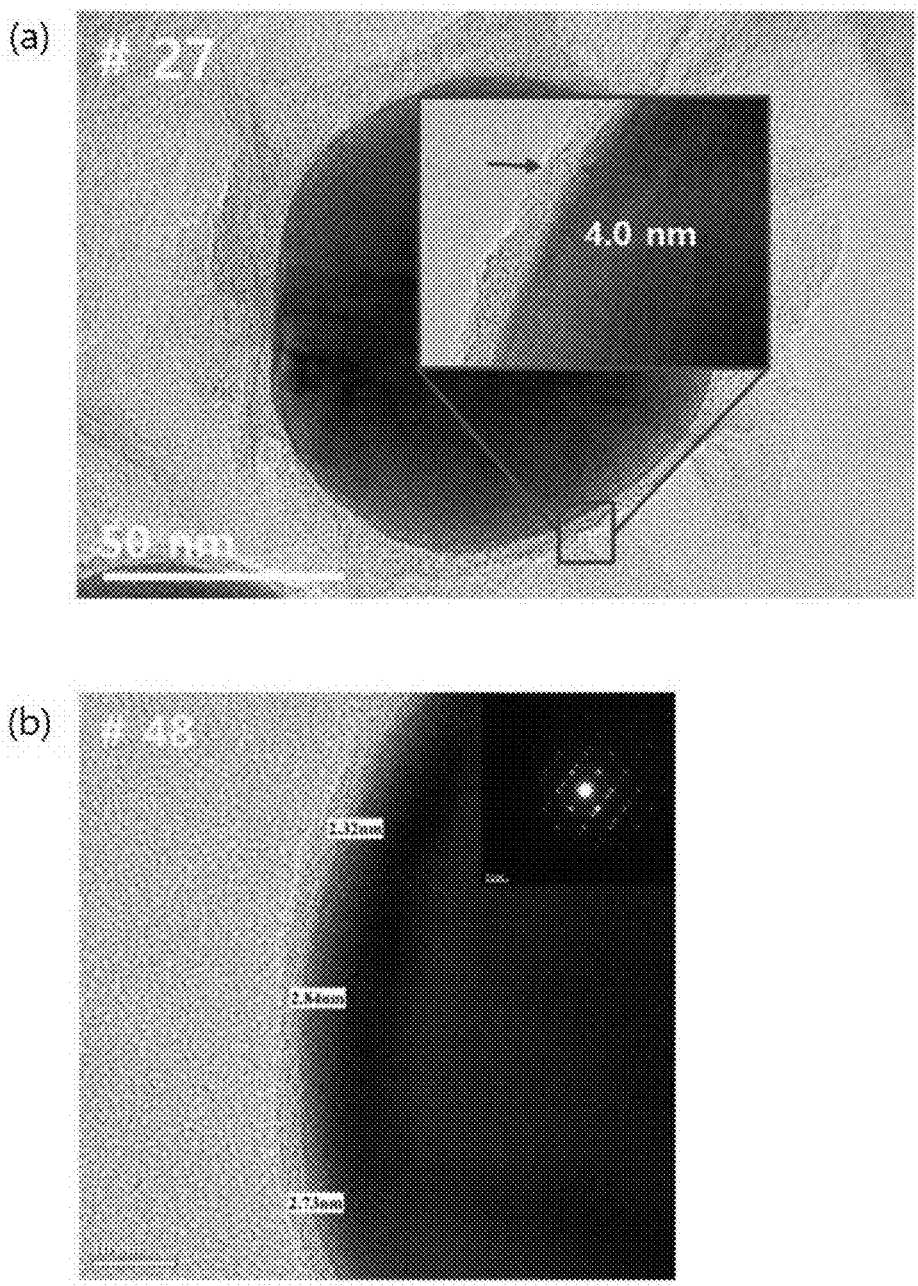

[Fig. 26]
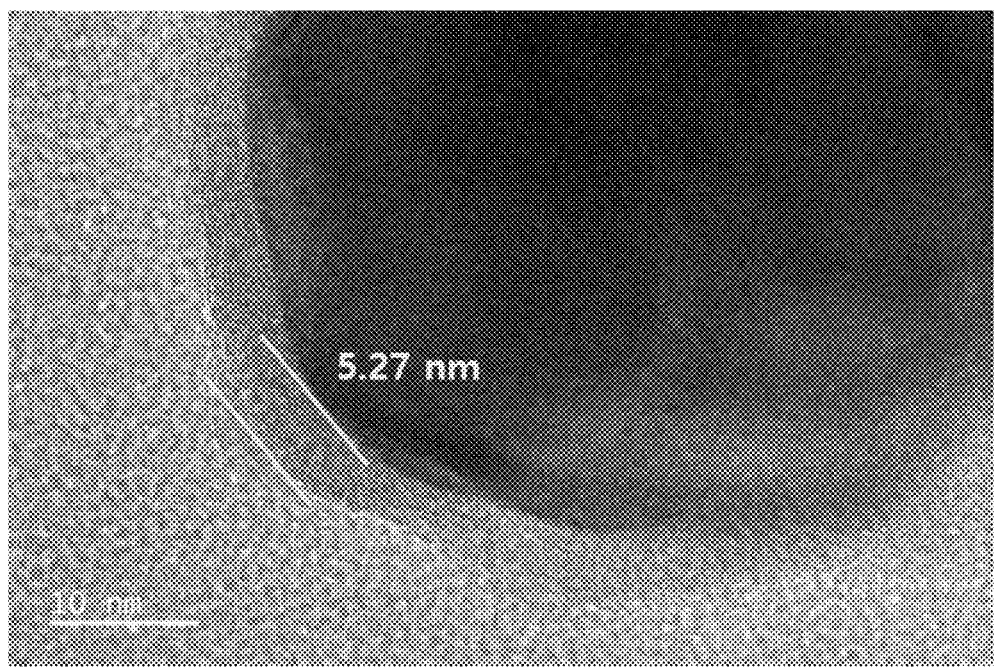

SEMICONDUCTOR DEVICE PACKAGE COMPRISING THERMAL INTERFACE LAYER AND METHOD OF FABRICATING OF THE SAME

CROSS REFERENCE TO RELATED APPLICATIONS

This application is a continuation of International Application PCT/KR2019/018092 (filed 19 Dec. 2019), which claims the benefit of Republic of Korea Patent Application 10-2019-0129518 (filed 18 Oct. 2019). Both of these priority applications are hereby incorporated herein by reference.

BACKGROUND OF THE INVENTION

1. Field of the Invention

The present application relates to a semiconductor device package including a thermal interface layer, and a method for manufacturing the same, and more specifically to a semiconductor device package including a thermal interface layer containing a metal core and a carbon shell surrounding the metal core, and a method for manufacturing the same.

2. Description of the Prior Art

With the progress of the high density integration and miniaturization of semiconductor devices, there has been an increase in the thermal density in the semiconductor devices. The increased thermal density may adversely affect the service life and reliability of the semiconductor devices. Accordingly, various thermal conductive materials have been developed to reduce the increased thermal density in the semiconductor devices.

Conventionally used thermal conductive materials mainly included polymer materials such as thermal grease or thermal paste, but a composite material has been prepared by mixing thermal conductive fillers such as metal, ceramic, carbon, etc., in order to improve heat-radiating properties. However, in case of composite materials including a polymer material and a thermal conductive filler, there are disadvantages in that the filler is not uniformly dispersed in the mixing process, and the like.

Accordingly, a study has been conducted on a structure in which a polymer thin film as a heat-radiating film including a thermal conductive material, and a thin film including a thermal conductive filler such as ceramic are stacked as a multilayer, or a structure in which a carbon-based thermal conductive filler without a polymer is stacked as a multilayer. For example, Korean Registered Patent Publication No. 10-1739047 (application no. 10-2015-0133524) discloses a method for manufacturing a heat-radiating panel with graphene/carbon nanotube composite thin films stacked as a multilayer, the method comprising: (1) oxidizing a heat-radiating panel to modify a surface of the heat-radiating panel; (2) preparing a carbon nanotube dispersive solution with a surface modified through an amine group or an amide group; (3) dipping the heat-radiating panel into the carbon nanotube dispersive solution to deposit the surface-modified carbon nanotube thin film onto the heat-radiating panel; (4) dipping the heat-radiating panel having gone through the step (3) into the graphene oxide dispersive solution to deposit a graphene oxide onto the carbon nanotube thin film, thereby forming a graphene oxide/carbon nanotube composite thin film on the heat-radiating panel; and (5) sequentially repeating the step (3) and the step (4) to stack the graphene oxide/carbon nanotube composite thin film as a multilayer, wherein the surface-modified carbon nanotube and the graphene oxide have electric charges opposite to each other on surfaces thereof.

SUMMARY OF THE INVENTION

One technical object of the present application is to provide a semiconductor device package including a thermal interface layer which contains a metal core/carbon shell and has improved thermal conductivity while having low electrical conductivity, as well as a method for preparing the same.

Another technical object of the present application is to provide a semiconductor device package including a thermal interface layer which includes an ultra-thin metal thin film prepared through a photo-sintering process, as well as a method for preparing the same.

Still another technical object of the present application is to provide a semiconductor device package with improved heat-transfer efficiency while having low electrical conductivity, as well as a method for preparing the same.

The technical objects of the present application are not limited to the above.

To solve the above technical objects, the present application provides a method for manufacturing a semiconductor device package.

According to one embodiment, the method for manufacturing the semiconductor device package may include providing a semiconductor device, preparing a thermal interface layer on the semiconductor device, and disposing a heat spreader on the thermal interface layer, in which the thermal interface layer includes a core shell composite containing a metal core and a carbon shell surrounding the metal core.

According to one embodiment, the preparation of the thermal interface layer may include forming a thermal paste layer on the semiconductor device, preparing a first thermal interface layer including the core shell composite on the thermal paste layer, preparing a preliminary thermal interface layer including a metal-organic composite that contains a metal particle and an organic matter bonded onto a surface of the metal particle through a thiol group on the first thermal interface layer, and photo-sintering the preliminary interface layer to prepare a second thermal interface layer.

According to one embodiment, the photo-sintering of the preliminary thermal interface layer may include primarily photo-sintering of the preliminary thermal interface layer to remove the organic matter from the metal-organic composite, and secondarily photo-sintering the primarily photo-sintered preliminary interface layer, so that the organic matter is removed from the metal-organic composite so as to form a metal thin film through sintering among the residual metal particles.

According to one embodiment, the secondarily photo-sintering of the primarily photo-sintered preliminary thermal interface layer may be performed under a condition that optical energy applied to the primarily photo-sintered preliminary thermal interface layer is 18.7 J/mm or more.

According to one embodiment, the metal particle of the metal-organic composite may include a metal which is the same type as the metal core of the core shell composite.

According to one embodiment, the metal-organic composite may be prepared by providing the metal particle and the gaseous organic matter into a reactor to bond a thiol group of the organic matter onto a surface of the metal particle, in which the organic matter may include at least one of butanethiol, octanethiol or decanethiol.

According to one embodiment, the preparing of the thermal interface layer may include providing a thermal interface material including the core shell composite and thermal grease, and providing the thermal interface material onto the semiconductor device to prepare the thermal interface layer.

According to one embodiment, the preparing of the core shell composite may include coating a pyrolytic polymer onto a surface of the metal particle to prepare a preliminary composite, and pyrolyzing the pyrolytic polymer of the preliminary composite to convert the pyrolytic polymer into the carbon shell.

To solve the above technical objects, the present application provides a semiconductor device package.

According to one embodiment, the semiconductor device package may include a semiconductor device, a heat spreader and a thermal interface layer containing a thermal interface material between the semiconductor device and the heat spreader, in which the thermal interface layer may include a core shell composite containing a metal core and a carbon shell surrounding the metal core.

According to one embodiment, the thermal interface layer may include a thermal paste on the semiconductor device, a first thermal interface layer including the core shell composite on the thermal paste, and a second thermal interface layer including a metal identical to the core shell composite on the first thermal interface layer.

According to one embodiment, the second thermal interface layer may include a metal particle which is melted and sintered.

According to one embodiment, the thermal interface layer may include the core shell composite and thermal grease.

According to one embodiment, the metal core may include copper.

A method for manufacturing a semiconductor device package according to an embodiment of the present invention may include providing a semiconductor device, preparing a thermal interface layer on the semiconductor device, and disposing a heat spreader on the thermal interface layer.

In this case, the thermal interface layer may have a core shell composite containing a metal core and a carbon shell surrounding the metal core. Accordingly, the thermal interface layer with high heat-radiating properties may be prepared.

Specifically, according to one embodiment, the thermal interface layer may have a structure, in which a thermal paste layer, a first thermal interface layer including the core shell composite, and a second thermal interface layer including a metal thin film are sequentially stacked.

In this case, the second thermal interface layer may be prepared by photo-sintering a metal-organic composite including a metal particle and an organic matter surrounding the metal particle. The photo-sintering may include primarily photo-sintering for removing the organic matter from the metal-organic composite, and secondarily photo-sintering for preparing a metal thin film by sintering the metal particle remaining in the metal-organic composite, from which the organic matter is removed.

In this case, the metal core of the core shell composite, the metal thin film which forms the second thermal interface layer, and the heat spreader may include the same metal element, and thus the first thermal interface layer, the second thermal interface layer and the heat spreader may be easily bonded together.

Alternatively, according to another embodiment, the thermal interface layer may have a structure including the core shell composite and thermal grease. The core shell composite may further include the carbon shell which has thermal conductivity and mechanical and physical properties higher than those of a metal particle. Accordingly, the thermal interface layer according to an embodiment of the present invention may have improved strength, structural stability and the like compared to a conventional thermal interface layer including the thermal grease and the metal particle.

BRIEF DESCRIPTION OF THE DRAWINGS

FIG. 1 is a flowchart for explaining a method for manufacturing a semiconductor device package according to an embodiment of the present invention.

FIGS. 2 to 6 are views for explaining a method for manufacturing a semiconductor device package including a thermal interface layer according to a first embodiment of the present invention.

FIG. 7 is a schematic view showing a semiconductor device package including a thermal interface layer according to a second embodiment of the present invention.

FIGS. 8 to 11 are views showing scanning electron microscopy (SEM) images of thermal interface layers according to Experimental Examples 1-1 to 1-4 of the present invention, as well as spectra of energy dispersive spectroscopy (EDS).

FIG. 12 is a view showing an average resistivity value depending on energy density of thermal interface layers according to Experimental Examples 1-1 to 1-4 of the present invention.

FIG. 13 is a view showing scanning electron microscopy (SEM) images of thermal interface layers according to Experimental Examples 2-1 to 2-2 of the present invention.

FIGS. 14 to 15 are views showing scanning electron microscopy (SEM) images of thermal interface layers according to Experimental Examples 3-1 to 3-2 of the present invention.

FIG. 16 is a view showing an average resistivity value of thermal interface layers according to Experimental Examples 3-1 to 3-2 of the present invention.

FIG. 17 is a view showing SEM pictures of core shell composites according to Experimental Examples 4-1 to 4-3 of the present invention.

FIG. 18 is a view showing Raman spectra of core shell composites according to Experimental Examples 4-1 to 4-3 of the present invention.

FIG. 19 is a view showing SEM pictures of core shell composites according to Experimental Examples 5-1 to 5-5 of the present invention.

FIG. 20 is a view showing SEM pictures of core shell composites according to Experimental Examples 6-1 to 6-2 of the present invention.

FIG. 21 is a view showing Raman spectra of core shell composites according to Experimental Examples 6-1 to 6-2 of the present invention.

FIG. 22 is a graph showing an ID/IG ratio of core shell composites according to Experimental Examples 6-1 to 6-2 of the present invention.

FIG. 23 is a view showing SEM pictures of a core shell composite according to Experimental Example 6-3 of the present invention.

FIG. 24 is a view showing a TEM picture for explaining a thickness of a carbon shell of a core shell composite according to Experimental Example 6-3 of the present invention.

FIG. 25 is a view showing a TEM picture for explaining a thickness of a carbon shell of a core shell composite according to Experimental Examples 7-1 and 7-2 of the present invention.

FIG. 26 is a view showing a TEM picture for explaining a thickness of a carbon shell of a core shell composite according to Experimental Example 7-3 of the present invention.

DETAILED DESCRIPTION OF THE EXEMPLARY EMBODIMENTS

Hereinafter, preferred embodiments of the present invention will be described in detail with reference to the accompanying drawings. However, the technical spirit of the present invention is not limited to the embodiments, but may be realized in different forms. The embodiments introduced herein are provided to sufficiently deliver the spirit of the present invention to those skilled in the art so that the disclosed contents may become thorough and complete.

When it is mentioned in the present specification that one element is on another element, it means that the first element may be directly formed on the second element or a third element may be interposed between the first element and the second element. Further, in the drawings, the thicknesses of the membrane and areas are exaggerated for efficient description of the technical contents.

In addition, in the various embodiments of the present specification, the terms such as first, second, and third are used to describe various elements, but the elements are not limited to the terms. The terms are used only to distinguish one element from another element. Accordingly, an element mentioned as a first element in one embodiment may be mentioned as a second element in another embodiment. The embodiments illustrated herein include their complementary embodiments. Further, the term "and/or" in the present specification is used to include at least one of the elements enumerated in the present specification.

In the specification, the terms of a singular form may include plural forms unless otherwise specified. Further, the terms "including" and "having" are used to designate that the features, the numbers, the steps, the elements, or combinations thereof described in the specification are present, and are not to be understood as excluding the possibility that one or more other features, numbers, steps, elements, or combinations thereof may be present or added.

Further, in the following description of the present invention, a detailed description of known functions or configurations incorporated herein will be omitted when it may make the subject matter of the present invention unnecessarily unclear.

Hereinafter, a method for manufacturing a semiconductor device package including a thermal interface layer according to a first embodiment of the present invention will be described.

FIG. 1 is a flowchart for explaining a method for manufacturing a semiconductor device package according to an embodiment of the present invention, and FIGS. 2 to 5 are views for explaining a method for manufacturing a semiconductor device package including a thermal interface layer according to a first embodiment of the present invention.

Referring to FIGS. 1 to 4, a semiconductor device (100) may be provided (S110). For example, the semiconductor device (100) may include various devices such as a diode, a transistor, a memory, an image sensor, application processor (AP), a display device, a central processing unit (CPU) or the like.

A thermal interface layer (200) may be prepared on the semiconductor device (100). The preparing of the thermal interface layer (200) may include forming a thermal paste layer (210) on the semiconductor device (100), forming a first thermal interface layer (220) on the thermal paste layer (210), and sequentially forming a second thermal interface layer (240) on the first thermal interface layer (220).

As shown in FIG. 2, the thermal paste layer (210) may be formed by applying a thermal paste onto the semiconductor device (100). The thermal paste layer (210) may improve adhesive force between the semiconductor device (100) and the first thermal interface layer (220).

The first thermal interface layer (220) may be formed on the thermal paste layer (210). The first thermal interface layer (220) may include a core shell composite (226). The core shell composite (226) may include a metal core (222) and a carbon shell (224) surrounding the metal core (222).

Specifically, the core shell composite (226) may be prepared sequentially by coating a pyrolytic polymer surrounding the metal core (222) to prepare a preliminary composite, and pyrolyzing the pyrolytic polymer to convert the pyrolytic polymer into a carbon shell (224). For example, the pyrolytic polymer may include a pyrolytic functional group represented by the following <Chemical Formula 1> and <Chemical Formula 2>.

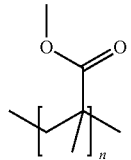

<Chemical Formula 1>

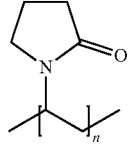

<Chemical Formula 2>

Here, the preparing of the preliminary composite may include dripping a solution containing a precursor of the metal core (222) into a solution containing the pyrolytic polymer to prepare a mixed solution, and heat-treating the mixed solution. In this case, a size of the metal core (222) may be adjusted by the dripping of the solution containing the precursor of the metal core (222). For example, the heat-treating of the mixed solution may be performed at a temperature of 200° C. for one hour. Further, carbonizing the polymer may include heat-treating the preliminary composite at a temperature of 800 to 900° C. or at a temperature of 950° C. or more.

According to one embodiment, the preliminary composite may be provided on a pre-determined substrate, then subjected to a rapid thermal process (RTP), then subjected to quick cooling, and then provided as a form of sheet. Also, the core shell composite (226) may be prepared from the preliminary composite, after which the sheet may be separated from the substrate, and then the sheet may be prepared in a form of flake. After that, a flake form of the core shell composite (226) may be mixed with thermal grease or thermal paste and then applied onto the semiconductor device (100) to form the first thermal interface layer (220).

For example, the core shell composite (226) may include the metal core (222) which is copper. In general, copper metal is known as a material having excellent electrical conductivity and thermal conductivity. Further, according to an embodiment of the present invention, the carbon shell (224) may be prepared into a noncrystalline form having pores, thereby having high thermal conductivity while having low electrical conductivity. Thus, the thermal interface layer (200) including the core shell composite (226) may have high heat-radiating properties.

In other words, according to one embodiment, the electrical conductivity of the metal core (222) may be decreased by the carbon shell (224). In other words, the core shell composite (226) in which the carbon shell (224) is formed on a surface of the metal core (222) may have lower electrical conductivity compared to the metal core (222) before the carbon shell (224) is formed.

According to one embodiment, a thickness of the carbon shell (224) may be controlled in order to reduce the electrical conductivity of the core shell composite (226) through the carbon shell (224). Specifically, for example, if a polymer having a high molecular weight (for example, PVP having a molecular weight of 45,000 to 55,000) is used as the pyrolytic polymer, a thickness of the carbon shell (224) may be increased, and thus the electrical conductivity of the core shell composite (226) may be decreased. Alternatively, as another example, in the process of preparing the preliminary composite, according to a method of increasing an amount of solution containing a precursor of the metal core (222) to be dripped into a solution containing the pyrolytic polymer, a size of the metal core (222) may be decreased to increase a thickness of the carbon shell (224), and thus the electrical conductivity of the core shell composite (226) may be decreased.

A source solution containing the core shell composite (226), which is prepared as described above, may be applied onto the thermal paste layer (210) and subjected to a drying process, and thus the first thermal interface layer (220) may be prepared.

The forming of the second thermal interface layer (240) may include forming the preliminary thermal interface layer (230) onto the first thermal interface layer (220), and photo-sintering the preliminary thermal interface layer (230) to prepare the second thermal interface layer (240).

The preliminary thermal interface layer (230) may include a metal-organic composite (236) containing a metal particle (232) and an organic matter (234) surrounding a surface of the metal particle (232).

The metal-organic composite (236) may be prepared by providing the gaseous organic matter (234) into a reaction container including the metal particle (232), and then bonding a thiol group of the organic matter (234) onto a surface of the metal particle (232). At the same time, the reaction container may be rotated, and thus the gaseous organic matter (234) may be bonded onto a surface of the metal particle (232) through a self-assembly reaction. For example, the organic matter (234) may include at least one of butanethiol, octanethiol or decanethiol.

The preliminary thermal interface layer (230) may be photo-sintered to prepare the second thermal interface layer (240). Specifically, as shown in FIG. 3, the second thermal interface layer (240) may be prepared through primarily photo-sintering the preliminary thermal interface layer (230), and secondarily photo-sintering the primarily photo-sintered preliminary thermal interface layer (230).

The primarily photo-sintering of the preliminary thermal interface layer (230) may include irradiating light onto the preliminary thermal interface layer (230) to remove the organic matter (234) from the metal-organic composite (236).

Here, as intensity of the optical energy decreases under the same total amount of the optical energy, a resistivity value and a porosity of the thermal interface layer (200) including the sintered preliminary thermal interface layer (230) may be reduced. Specifically, for example, in the primarily photo-sintering, a total amount of optical energy applied onto the preliminary thermal interface layer (230) may be 6.3 J/mm.

Unlike the above, a second thermal interface layer (240) may be prepared without the primarily photo-sintering. In other words, the second thermal interface layer (240) may be prepared through secondarily photo-sintering right after the preparing of the preliminary thermal interface layer (230). In this case, the prepared second thermal interface layer (240) may have a relatively higher porosity and a higher resistivity value than those of the second thermal interface layer (240) prepared through the primarily photo-sintering prepared according to an embodiment of the present invention.

As described above, however, according to an embodiment of the present invention, the second thermal interface layer (240) may be prepared sequentially through the primarily photo-sintering of the preliminary thermal interface layer (230) and the secondarily photo-sintering. Accordingly, the second thermal interface layer (240) may have a low porosity and a low resistivity value. In other words, the second thermal interface layer (240) prepared according to an embodiment of the present invention may have heat-radiating properties substantially higher than those of the second thermal interface layer (240) prepared without including the primarily photo-sintering.

As shown in FIG. 3, the secondarily photo-sintering of the primarily photo-sintered preliminary thermal interface layer (230) may be performed by irradiating light having energy larger than that of the primarily photo-sintering onto the primarily photo-sintered preliminary thermal interface layer (230). Accordingly, a surface of the metal particle (232) remaining after removing the organic matter (234) from the metal-organic composite (236) may be melted, thereby causing sintering between the metal particles (232). In other words, it may be possible to form the second thermal interface layer (240) having a structure of metal thin film in which the residual metal particle (232) is sintered after secondarily photo-sintering the primarily photo-sintered preliminary thermal interface layer (230).

Specifically, for example, in the secondarily photo-sintering, a total amount of optical energy applied onto the primarily photo-sintered preliminary thermal interface layer (230) may be more than 20 J/mm and less than 24 J/mm.

Unlike the above, if a total amount of the optical energy applied onto the primarily photo-sintered preliminary thermal interface layer (230) is 20 J/mm or less, a porosity of the second thermal interface layer (240) may be increased. In other words, as a total amount of the optical energy is decreased, a degree to which a surface of the metal particle (232) is melted may be decreased, and thus a degree of being sintered between the metal particles (232) may be decreased.

However, according to an embodiment of the present invention, if a total amount of the optical energy applied onto the primarily photo-sintered preliminary thermal interface layer (230) is more than 20 J/mm and less than 24 J/mm, a porosity of the thermal interface layer (200) including the second thermal interface layer (240) may be decreased.

According to one embodiment, as shown in FIG. 2, the preliminary thermal interface layer (230) may be prepared into the single-layered metal-organic composite (236). In other words, a thickness of the preliminary thermal interface layer (230) may have a value substantially the same as a diameter of the metal-organic composite (236).

Unlike the above, the preliminary thermal interface layer (230) may be manufactured in such a way that the metal-organic composite (236) is stacked. In other words, if a thickness of the preliminary thermal interface layer (230) is increased more than a diameter of the metal-organic composite (236), the insulating properties of the thermal interface layer according to a first embodiment including the first thermal interface layer (220) and the second thermal interface layer (240) may be decreased.

Thus, as described above, the preliminary thermal interface layer (230) may be prepared into the single-layered metal-organic composite (236), and thus the insulating properties of the thermal interface layer according to the first embodiment of the present invention may be improved.

Referring to FIGS. 1 and 5, a heat spreader (300) may be disposed on the thermal interface layer (200) (S130).

For example, the heat spreader (300) may include copper.

As shown in FIG. 5, the heat spreader (300) may be provided onto the thermal interface layer (200). As described above, the second thermal interface layer (240) may include the metal thin film. In this case, the metal thin film may include a metal identical to the heat spreader (300). Accordingly, the thermal interface layer (200) and the heat spreader (300), which are prepared according to the first embodiment of the present invention, may be easily bonded.

As described above, it is possible to manufacture a semiconductor device package including the semiconductor device (100), a thermal interface layer (200) on the semiconductor device (100), and a heat spreader (300) on the thermal interface layer (200). Specifically, as shown in FIG. 5, the semiconductor device package may include a thermal interface layer (200) according to the first embodiment of the present invention, in which the thermal paste layer (210), the first thermal interface layer (220) and the second thermal interface layer (240) are sequentially stacked.

Hereinafter, a method for manufacturing a semiconductor device package including a thermal interface layer according to a second embodiment of the present invention will be described.

FIG. 6 is a schematic view showing a semiconductor device package including a thermal interface layer according to a second embodiment of the present invention.

Referring to FIG. 6, it is possible to manufacture a semiconductor device package including the semiconductor device (100), a thermal interface layer (200) according to the second embodiment of the present invention including the core shell composite (226) on the semiconductor device (100), and a heat spreader (300) on the thermal interface layer (200).

Here, the semiconductor device (100) and the heat spreader (300) correspond to the semiconductor device (100) described in the method for manufacturing a semiconductor device package including the thermal interface layer (200) according to the first embodiment of the present invention, and thus detailed description thereof will be omitted.

As described above, the thermal interface layer (200) according to the second embodiment of the present invention may be prepared on the semiconductor device (100). The core shell composite (226) may be prepared as described above in the method for preparing the thermal interface layer (200) according to the first embodiment of the present invention.

Specifically, the thermal interface layer (200) according to the second embodiment of the present invention may be prepared by applying a thermal interface material including the core shell composite (226) and thermal grease (228) onto the semiconductor device (100). For example, the thermal interface material may include 80 parts by weight of the core shell composite (226) and 20 parts by weight of the thermal grease (228).

In this case, the thermal grease (228) may improve adhesive force of the thermal interface layer (200) interposed between the semiconductor device (100) and the heat spreader (300). Accordingly, unlike the thermal interface layer (200) according to the first embodiment of the present invention, the thermal interface layer (200) according to the second embodiment may be prepared into a single-layered structure including the core shell composite (226) and the thermal grease (228). For example, the thermal grease (228) may include a particle having at least one material of ceramic or metal. Specifically, for example, the ceramic may include at least one selected from aluminum oxide, boron nitride or the like, and the metal may include at least one selected from copper, silver or the like.

In general, a conventional thermal interface layer may be prepared to include a metal particle and thermal grease. However, the thermal interface layer (200) according to the second embodiment of the present invention may include the core shell composite (226) instead of the metal particle. As described above, the core shell composite (226) may further include the carbon shell (224) compared to the metal particle, thereby improving mechanical and physical properties.

Thus, the thermal interface layer (220) according to the second embodiment of the present invention may easily show an improvement in mechanical and physical properties such as strength, structural stability and the like compared to the conventional thermal interface layer.

As described above with reference to FIGS. 1 to 6, it may be possible to manufacture the semiconductor device package including the semiconductor device (100), the thermal interface layer (200) including the core shell composite (226) on the semiconductor device (100), and the heat spreader (300) on the thermal interface layer (200).

As shown in FIG. 5, the thermal interface layer (200) according to the first embodiment of the present invention may have a structure in which the thermal paste layer (210), a first thermal interface layer (220) including the core shell composite (226), and a second thermal interface layer (240) including the metal thin film are sequentially stacked. Further, as shown in FIG. 6, the thermal interface layer (200) according to the second embodiment of the present invention may include the core shell composite (226) and the thermal grease (228).

As described above, the thermal interface layer (200) may include the core shell composite (226), thereby improving heat-radiating properties. Thus, the thermal interface layer may be used in various fields of industry, which require heat radiation, including display devices such as a liquid crystal display (LCD) or an organic light-emitting diode (OLED), automobiles, aircrafts and the like, which include the semiconductor device (100). Specifically, the semiconductor device (100) includes all the devices requiring heat radiation due to high electric power consumption, such as non-memory devices, power devices, LED devices, light-receiving devices, etc., and the technical spirit according to an embodiment of the present invention may be applied to a heterogeneous packaging structure such as Si interposer packaging and 3D packaging, which are the next-generation packaging structure.

FIG. 7 is a view for illustrating an example of applying a thermal interface layer according to an embodiment of the present invention.

Referring to FIG. 7, a semiconductor packaging structure is provided. A thermal interface layer (510) according to an embodiment of the present invention as described above may be applied between a semiconductor chip (500) and a PCB layer (520). In other words, the thermal interface layer (510) according to an embodiment of the present invention may be used along with Sn/Ag solder for connection between the semiconductor chip (500) and the PCB layer (520).

Alternatively, the Sn/Ag solder (530) and a metal plate (540) may be provided in a lower part of the PCB layer (520) and a thermal interface layer (550) according to an embodiment of the present invention may be applied between the metal plate (540) and a heat-radiating pin (560).

Besides, the thermal interface layer according to an embodiment of the present invention may be applied to various structures for heat radiation, and it is apparent that the technical spirit according to an embodiment of the present invention is not limited to the specific scope of application.

Hereinafter, a method for preparing a thermal interface layer according to a specific experimental example of the present invention and the results of evaluating properties will be described.

It is obvious that the technical idea and concept according to an embodiment of the present application is not limited to that shown in FIG. 7, and can be applied to the advanced semiconductor packaging method such as embedded multi-die interconnect bridge (EMIB), integrated fan-out wafer level package (InFOWLP), or Si interposer.

PREPARING OF THERMAL INTERFACE LAYER ACCORDING TO EXPERIMENTAL EXAMPLE 1-1

A copper nanoparticle was provided into a rotating reaction container while maintaining a vacuum state inside the reaction container.

1-octanethiol in a liquid state was provided into the reaction container to vaporize the octanethiol in a liquid state.

The reaction container was rotated to prepare a metal-organic composite in which the octanethiol was coated onto a surface of the copper nanoparticle through a self-assembly reaction.

30 parts by weight of 1-octanol and remaining parts by weight of the metal-organic composite were mixed together and then subjected to ultrasonication for 30 minutes so as to prepare ink.

The ink was applied onto a polyimide (PI) substrate and then dried to prepare a preliminary thermal interface layer including the metal-organic composite on the substrate.

Optical energy (1.5 MW, 2 ms) having an energy density of 9.1 J/cm$^2$ was irradiated onto the preliminary thermal interface layer to prepare a thermal interface layer according to Experimental Example 1-1.

PREPARING OF THERMAL INTERFACE LAYER ACCORDING TO EXPERIMENTAL EXAMPLE 1-2

The same method was performed as described above in Experimental Example 1-1, but the optical energy (1.5 MW, 3 ms) having an energy density of 14.3 J/cm$^2$ was irradiated onto the preliminary thermal interface layer instead of the optical energy (1.5 MW, 2 ms) having an energy density of 9.1 J/cm$^2$, thereby preparing a thermal interface layer according to Experimental Example 1-2.

PREPARING OF THERMAL INTERFACE LAYER ACCORDING TO EXPERIMENTAL EXAMPLE 1-3

The same method was performed as described above in Experimental Example 1-1, but the optical energy (1.5 MW, 4 ms) having an energy density of 20 J/cm$^2$ was irradiated onto the preliminary thermal interface layer instead of the optical energy (1.5 MW, 2 ms) having an energy density of 9.1 J/cm$^2$, thereby preparing a thermal interface layer according to Experimental Example 1-3.

PREPARING OF THERMAL INTERFACE LAYER ACCORDING TO EXPERIMENTAL EXAMPLE 1-4

The same method was performed as described above in Experimental Example 1-1, but the optical energy (1.5 MW, 5 ms) having an energy density of 24.7 J/cm$^2$ was irradiated onto the preliminary thermal interface layer instead of the optical energy (1.5 MW, 2 ms) having an energy density of 9.1 J/cm$^2$, thereby preparing a thermal interface layer according to Experimental Example 1-4.

The conditions for photo-sintering of thermal interface layers according to Experimental Examples 1-1 to 1-4 as described above are shown in the following <Table 1>.

TABLE 1

| | Energy density (J/cm$^2$) | Energy intensity (MW) | Energy application time |
|---|---|---|---|
| Experimental Example 1-1 | 9.1 | 1.5 | 2 ms, 1 pulse |
| Experimental Example 1-2 | 14.3 | 1.5 | 3 ms, 1 pulse |
| Experimental Example 1-3 | 20 | 1.5 | 4 ms, 1 pulse |
| Experimental Example 1-4 | 24.7 | 1.5 | 5 ms, 1 pulse |

FIGS. 8 to 11 are views showing scanning electron microscopy (SEM) images of thermal interface layers according to Experimental Examples 1-1 to 1-4 of the present invention, as well as spectra of energy dispersive spectroscopy (EDS).

Referring to FIGS. 8 to 11, as can be understood from <Table 1>, the thermal interface layers according to Experimental Examples 1-1 to 1-4 of the present invention were prepared by irradiating the optical energy having the same energy intensity for different times.

As shown in FIGS. 8 to 11, as an application time of the optical energy is increased, necking between the copper nanoparticles may be increased, thereby preparing a more densified copper thin film.

Thus, as can be understood from FIG. 11, it was confirmed that the thermal interface layer according to Experimental Example 1-4 has the most densified copper thin film.

FIG. 12 is a view showing an average resistivity value depending on energy density of thermal interface layers according to Experimental Examples 1-1 to 1-4 of the present invention.

Referring to FIG. 12, an average resistivity value of thermal interface layers according to Experimental Examples 1-1 to 1-4 of the present invention are shown in the following <Table 2>.

TABLE 2

|  | Average resistivity ($\times 10^{-7} \Omega \cdot m$) |
|---|---|
| Experimental Example 1-1 | 22.3 |
| Experimental Example 1-2 | 5.5 |
| Experimental Example 1-3 | 3.1 |
| Experimental Example 1-4 | 2.7 |

As can be understood from FIG. 12 and <Table 1> to <Table 2>, it can be understood that the thermal interface layer has a lower average resistivity value as an application time of optical energy is increased while the optical energy having the same intensity is applied.

PREPARING OF THERMAL INTERFACE LAYER ACCORDING TO EXPERIMENTAL EXAMPLE 2-1

The same method was performed as described above in Experimental Example 1-1, but an optical energy (0.25 MW, 10 ms) having a total amount of 6.3 J/mm was irradiated onto the preliminary thermal interface layer instead of applying an optical energy (1.5 MW, 2 ms) having an energy density of 9.1 J/cm$^2$, that is, the optical energy of 18.6 J/mm, thereby preparing a thermal interface layer according to Experimental Example 2-1.

PREPARING OF THERMAL INTERFACE LAYER ACCORDING TO EXPERIMENTAL EXAMPLE 2-2

The same method was performed as described above in Experimental Example 1-1, but an optical energy (0.5 MW, 5 ms) having a total amount of 6.3 J/mm was irradiated onto the preliminary thermal interface layer instead of applying an optical energy (1.5 MW, 2 ms) having an energy density of 9.1 J/cm$^2$, that is, the optical energy of 18.6 J/mm, thereby preparing a thermal interface layer according to Experimental Example 2-2.

The conditions for photo-sintering of thermal interface layers as described above in Experimental Examples 2-1 to 2-2 are shown in the following <Table 3>.

TABLE 3

|  | Total energy (J/mm) | Energy intensity (MW) | Energy application time |
|---|---|---|---|
| Experimental Example 2-1 | 6.3 | 0.25 | 10 ms, 1 pulse |
| Experimental Example 2-2 | 6.3 | 0.5 | 5 ms, 1 pulse |

FIG. 13 is a view showing scanning electron microscopy (SEM) images of thermal interface layers according to Experimental Examples 2-1 to 2-2 of the present invention.

Referring to FIG. 13, as can be understood from <Table 2>, the thermal interface layers according to Experimental Examples 2-1 to 2-2 of the present invention were prepared in such a way that energy intensities and energy application times are different from each other under the same total amount of the optical energy applied. An average thickness of thermal interface layers according to Experimental Examples 2-1 to 2-2 are shown in the following <Table 4>.

TABLE 4

|  | Average thickness (μm) |
|---|---|
| Experimental Example 2-1 | 1.55 ± 0.11 |
| Experimental Example 2-2 | 1.52 ± 0.14 |

As described above, the thermal interface layer according to Experimental Example 2-2 as shown in (b) of FIG. 13 was prepared by applying higher energy for a shorter time than the thermal interface layer according to Experimental Example 2-1 as shown in (a) of FIG. 12. However, as can be understood from FIG. 13 and <Table 4>, it can be understood that the thermal interface layers according to Experimental Examples 2-1 to 2-2 have a surface and a thickness substantially similar to each other.

PREPARING OF THERMAL INTERFACE LAYER ACCORDING TO EXPERIMENTAL EXAMPLE 3-1

The same method was performed as described above in Experimental Example 2-1, but an optical energy (0.25 MW, 10 ms) having a total amount of 6.3 J/mm was irradiated onto the preliminary thermal interface layer and then an optical energy (1.5 MW, 5 ms) having a total amount of 18.7 J/mm was further irradiated thereto as described above in Experimental Example 1-4, thereby preparing a thermal interface layer according to Experimental Example 3-1.

PREPARING OF THERMAL INTERFACE LAYER ACCORDING TO EXPERIMENTAL EXAMPLE 3-2

The same method was performed as described above in Experimental Example 2-2, but an optical energy (0.5 MW, 5 ms) having a total amount of 6.3 J/mm was irradiated onto the preliminary thermal interface layer and then an optical energy (1.5 MW, 5 ms) having a total amount of 18.7 J/mm was further irradiated thereto as described above in Experimental Example 1-4, thereby preparing a thermal interface layer according to Experimental Example 3-1.

The conditions for photo-sintering of thermal interface layers as described above in Experimental Examples 3-1 and 3-2 are shown in the following <Table 5>.

TABLE 5

|  | Primary photo-sintering condition | Secondary photo-sintering condition |
|---|---|---|
| Experimental Example 3-1 | 6.3 J/mm(0.25 MW, 10 ms, 1 pulse) | 18.7 J/mm (1.5 MW, 5 ms, 1 pulse) |
| Experimental Example 3-2 | 6.3 J/mm (0.5 MW, 5 ms, 1 pulse) |  |

FIGS. 14 to 15 are views showing scanning electron microscopy (SEM) images of thermal interface layers according to Experimental Examples 3-1 to 3-2 of the present invention.

Referring to FIGS. 14 to 15, thermal interface layers according to Experimental Examples 3-1 to 3-2 of the present invention were prepared in such a way that thermal interface layers according to Experimental Examples 2-1 to 2-2 as described above with reference to FIG. 13 was further subjected to photo-sintering treatment as shown in a method for preparing a thermal interface layer according to Experimental Example 1-4 as described above with reference to <Table 1> and FIG. 11.

In other words, thermal interface layers according to Experimental Examples 3-1 to 3-2 were prepared by carrying out primarily photo-sintering (thermal interface layers according to Experimental Examples 2-1 to 2-2) and then further carrying out secondarily photo-sintering having energy higher than the primarily photo-sintering.

An average thickness and a surface porosity of thermal interface layers according to Experimental Examples 3-1 to 3-2, which were prepared as described above, are shown in the following <Table 6>.

TABLE 6

|  | Average thickness (μm) | Surface porosity (%) |
|---|---|---|
| Experimental Example 3-1 | 1.59 ± 0.13 | 3.8 |
| Experimental Example 3-2 | 1.51 ± 0.10 | 9.1 |

Unlike the above in FIG. 13, referring to <Table 6> and FIGS. 14 and 15, it can be understood that a copper thin film having a lower surface porosity, that is, being more densified, is obtained in case of irradiating an optical energy having a relatively low intensity under the same total amount of energy for a long time in primarily photo-sintering.

FIG. 16 is a view showing an average resistivity value of thermal interface layers according to Experimental Examples 3-1 to 3-2 of the present invention.

Referring to FIG. 16, a resistivity value of thermal interface layers according to Experimental Examples 3-1 to 3-2 of the present invention are shown in the following <Table 7>.

TABLE 7

|  | Resistivity value ($\times 10^{-7} \Omega \cdot m$) |
|---|---|
| Experimental Example 3-1 | 0.84 ± 0.36 |
| Experimental Example 3-2 | 0.96 ± 0.61 |

As described above with reference to FIGS. 14 to 15, it can be understood that a thermal interface layer according to Experimental Example 3-1 has a copper thin film more densified than a thermal interface layer according to Experimental Example 3-2, and thus it can be confirmed that the thermal interface layer according to Experimental Example 3-1 has a resistivity vale lower than that of the thermal interface layer according to Experimental Example 3-2.

As described above in FIGS. 14 to 15, an average thickness, a surface porosity and a resistivity value of the thermal interface layer according to Experimental Example 2-1 prepared under the condition for primary photo-sintering, and the thermal interface layer according to Experimental Example 1-4 prepared under the condition for secondary photo-sintering are shown in the following <Table 8>.

TABLE 8

|  | Average thickness (μm) | Surface porosity (%) | Resistivity value ($\times 10^{-7} \Omega \cdot m$) |
|---|---|---|---|
| Experimental Example 2-1 | 1.52 ± 0.14 | 48.7 | X |
| Experimental Example 1-4 | 1.58 ± 0.13 | 29.7 | 2.65 ± 0.35 |

As can be understood from <Table 6> to <Table 8>, it can be understood that the thermal interface layer (Experimental Example 2-1) prepared under the condition for primary photo-sintering has a surface porosity higher than that of the thermal interface layer (Experimental Example 1-4) prepared under the condition for secondary photo-sintering. Further, it was confirmed that the thermal interface layer according to Experimental Example 3-1 prepared through both the primary photo-sintering and the secondary photo-sintering has a surface porosity and a resistivity value lower than those of the thermal interface layer (Experimental Example 1-4) prepared under the secondary photo-sintering only without the primary photo-sintering.

PREPARING OF CORE SHELL COMPOSITE ACCORDING TO EXPERIMENTAL EXAMPLE 4-1

A copper particle having a size of 100 nm was provided as a metal core and PVP was provided as a pyrolytic polymer.

A mixed solution of PVP and the copper particles (PVP 20 wt %) was applied onto a $SiO_2$ substrate, then heat-treated at a heating rate of 60° C./min under the processing conditions of Ar/H2 of 70 sccm each and 875° C. for two minutes, and then cooled down for about ten minutes to prepare a core shell composite having a copper core and a carbon shell.

PREPARING OF CORE SHELL COMPOSITE ACCORDING TO EXPERIMENTAL EXAMPLE 4-2

The same method was performed as described above in Experimental Example 4-1, but PVP was controlled at a ratio of 30 wt % to prepare a core shell composite.

PREPARING OF CORE SHELL COMPOSITE ACCORDING TO EXPERIMENTAL EXAMPLE 4-3

The same method was performed as described above in Experimental Example 4-1, but PVP was controlled at a ratio of 50 wt % to prepare a core shell composite.

TABLE 9

|  | PVP ratio |
|---|---|
| Experimental Example 4-1 | 20 wt % |
| Experimental Example 4-2 | 30 wt % |
| Experimental Example 4-3 | 50 wt % |

FIG. 17 is a view showing SEM pictures of core shell composites according to Experimental Examples 4-1 to 4-3 of the present invention, and FIG. 18 is a view showing Raman spectra of core shell composites according to Experimental Examples 4-1 to 4-3 of the present invention. In FIGS. 17 and 18, (a), (b) and (c) correspond to Experimental Examples 4-1 to 4-3, respectively.

Referring to FIG. 17, SEM pictures were taken of core shell composites according to Experimental Examples 4-1 to 4-3. If a ratio of PVP is 20 wt % according to Experimental Example 4-1, a necking phenomenon is found between copper particles. On contrary, it can be confirmed that the necking phenomenon is decreased, if the ratio of PVP is 30 wt % and 50 wt % according to Experimental Examples 4-2 and 4-3. Further, it can be confirmed that the necking is decreased as the ratio of PVP is increased.

Consequently, it can be confirmed that controlling the ratio of PVP, which is a pyrolytic polymer, within a range of exceeding 20 wt % is an efficient method for preventing the copper particles from necking.

Referring to FIG. 18, Raman spectrum was measured with regard to core shell composites according to Experimental Examples 4-1 to 4-3. In Raman spectrum, an ID/IG ratio of core shell composites of Experimental Examples 4-1, 4-2 and 4-3 was measured to be 0.837, 0.80 and 0.84. Consequently, it can be confirmed that controlling the ratio of PVP to be more than 20 wt % and less than 50 wt % is an efficient method for preparing a carbon shell with less defects.

PREPARING OF CORE SHELL COMPOSITES ACCORDING TO EXPERIMENTAL EXAMPLES 5-1 TO 5-5

The same process was performed as described above in Experimental Example 4-2, but a heat-treatment process was carried out while controlling a flow of Ar and H2 as shown in the following <Table 10>.

TABLE 10

|  | Ar flow (sccm) | H2 flow (sccm) | Ar/H2 ratio |
|---|---|---|---|
| Experimental Example 5-1 | 70 | 70 | 1:1 |
| Experimental Example 5-2 | 80 | 60 | 1:0.75 |
| Experimental Example 5-3 | 93 | 47 | 1:0.5 |
| Experimental Example 5-4 | 112 | 28 | 1:0.25 |
| Experimental Example 5-5 | 140 | 0 | 1:0 |

FIG. 19 is a view showing SEM pictures of core shell composites according to Experimental Examples 5-1 to 5-5 of the present invention.

Referring to FIG. 19, SEM pictures were taken of cores shell composites according to Experimental Examples 5-1 to 5-5. It can be understood that a necking phenomenon does not substantially occur between the copper particles, if a ratio of Ar/H2 is 1:1, 1:0.75 and 1:0.5 according to Experimental Examples 5-1 to 5-3. On contrary, it can be confirmed that the necking phenomenon occurs, if the ratio of Ar/H2 is 1:0.25 and 1:0 according to Experimental Examples 5-4 and 5-5.

Consequently, it can be confirmed that controlling the ratio of Ar/H2 to be 1:1 to 0.5 is an efficient method for preventing the copper particles from necking.

PREPARING OF CORE SHELL COMPOSITE ACCORDING TO EXPERIMENTAL EXAMPLE 6-1

A copper particle having a size of 100 nm was provided as a metal core and PVP was provided as a pyrolytic polymer.

A mixed solution of PVP and the copper particles (PVP 50 wt %) was applied onto a SiO2 substrate, then heat-treated at a heating rate of 60° C./min under the processing conditions of Ar/H2 of 70 sccm each and 875° C. for two minutes, and then cooled down for about ten minutes to prepare a core shell composite having a copper core and a carbon shell.

PREPARING OF CORE SHELL COMPOSITE ACCORDING TO EXPERIMENTAL EXAMPLE 6-2

The same process was performed as shown in Experimental Example 6-1, but a heat-treatment process was performed while being covered with a copper foil.

FIG. 20 is a view showing SEM pictures of core shell composites according to Experimental Examples 6-1 to 6-2 of the present invention, FIG. 21 is a view showing Raman spectra of core shell composites according to Experimental Examples 6-1 to 6-2 of the present invention, and FIG. 22 is a graph showing an ID/IG ratio of core shell composites according to Experimental Examples 6-1 to 6-2 of the present invention.

Referring to FIGS. 20 to 22, SEM pictures were taken of core shell composites according to Experimental Examples 6-1 to 6-2 of the present invention and Raman spectrum was measured. In case of the core shell composite according to Experimental Example 6-2 which was covered with a copper foil during the heat-treatment, an ID/IG ratio was measured to be 0.70. In case of the core shell composite according to Experimental Example 6-1 which was not covered with a copper foil, an ID/IG ratio was measured to be 0.74. In other words, in case of carrying out heat-treatment while being covered with a copper foil, it can be confirmed that defects in the carbon shell are decreased by preventing an oxygen atom from being adsorbed. And, it can be confirmed that covering with the copper foil during heat-treatment is an efficient method for removing defects from the carbon shell of the core shell composite.

PREPARING OF CORE SHELL COMPOSITE ACCORDING TO EXPERIMENTAL EXAMPLE 6-3

A copper particle having a size of 100 nm was provided as a metal core and PVP was provided as a pyrolytic polymer.

A mixed solution of PVP and the copper particles (PVP 20 wt %) was applied onto a SiO2 substrate, then heat-treated at a heating rate of 60° C./min under the processing conditions of Ar/H2 of 70 sccm each and 875° C. for two minutes while being covered with a copper foil, and then cooled down for about ten minutes to prepare a core shell composite having a copper core and a carbon shell.

FIG. 23 is a view showing SEM pictures of a core shell composite according to Experimental Example 6-3 of the present invention.

Referring to FIG. 23, SEM pictures were taken of a core shell composite according to Experimental Example 6-3 of the present invention. As can be understood from FIG. 23, it can be confirmed that a core shell composite having a copper core and a carbon shell is formed without necking.

FIG. 24 is a view showing a TEM picture for explaining a thickness of a carbon shell of a core shell composite according to Experimental Example 6-3 of the present invention.

Referring to FIG. 24, a thickness of the carbon shell of the core shell composite according to Experimental Example 6-3 was measured to be 4 nm, and a resistivity value of the core shell composite according to Experimental Example 6-3 was measured to be $5.5*10^{-7}$ Ωm. In other words, it can be confirmed that controlling the carbon shell to be thick is an efficient method for decreasing electrical conductivity of the core shell composite.

Further, it can be confirmed that resistance of the core shell composite according to Experimental Example 6-3 is increased at least 30 times compared to a copper particle. In other words, it can be confirmed that resistance is increased and electrical conductivity is decreased through the carbon shell in an amorphous state.

TABLE 11

|  | Resistance | Electrical conductivity |
| --- | --- | --- |
| Copper particle | $1.7 \times 10^{-8}$ Ωm | $58.8 \times 10^6$ |
| Experimental Example 6-3 | $5.5 \times 10^{-7}$ Ωm | $18.2 \times 10^5$ |

Further, a pellet having a diameter of 9.8 mm and a thickness of 0.77 mm was prepared by using the core shell composite according to Experimental Example 6-3 and a thermal diffusion rate was measured as shown in <Table 12>. As a result of multiplying values of thermal diffusion rate, specific heat and density, thermal conductivity was measured to be 11.34 W/mK. Considering that the thermal conductivity of a high-grade thermal grease is 8.5 W/mK, it can be confirmed that the core shell composite according to an embodiment of the present invention has excellent heat-radiating properties.

TABLE 12

| Thermal diffusivity (mm2/s) | 3.75 |
| --- | --- |
| Specific heat (J/mK) | 0.388 |
| Density (g/cm3) | 7.793 |

PREPARING OF CORE SHELL COMPOSITE ACCORDING TO EXPERIMENTAL EXAMPLE 7-1

$CuSO_4H_2O$ was provided as a copper precursor and PVP having a molecular weight of 45,000 to 55,000 was provided as a pyrolytic polymer.

The copper precursor and PVP were mixed in solvent (ultra-pure) and heat-treated at 200° C. for one hour to prepare a preliminary composite including a copper core (diameter of 100 nm) and PVP surrounding the same. The preliminary composite was heat-treated at a heating rate of 60° C./min under the processing conditions of Ar/H2 of 93 sccm and 47 sccm respectively and 875° C. for two minutes to prepare a core shell composite having a copper core and a carbon shell.

PREPARING OF CORE SHELL COMPOSITE ACCORDING TO EXPERIMENTAL EXAMPLE 7-2

A preliminary composite was prepared according to the same process as described above in Experimental Example 7-1 by using PVP having a molecular weight of 3,500 to 4,500.

The preliminary composite was heat-treated at a heating rate of 60° C./min under the processing conditions of Ar/H2 of 70 sccm each and 875° C. for two minutes to prepare a core shell composite having a copper core and a carbon shell.

FIG. 25 is a view showing a TEM picture for explaining a thickness of a carbon shell of a core shell composite according to Experimental Examples 7-1 and 7-2 of the present invention.

Referring to FIG. 25, the TEM picture was taken of core shell composites according to Experimental Examples 7-1 and 7-2 as described above so as to measure a thickness of carbon shell. In case of using PVP having a relatively high molecular weight according to Experimental Example 7-1, a thickness of carbon shell was measured to be 4.0 nm. On contrary, in case of using PVP having a relatively low molecular weight according to Experimental Example 7-2, a thickness of carbon shell was measured to be 2.32 to 2.84 nm. In other words, it can be confirmed that controlling a molecular weight of a pyrolytic polymer is an efficient method for controlling a thickness of the carbon shell. And, it can be confirmed that preparing a carbon shell by using a pyrolytic polymer having a high molecular weight is an efficient method for decreasing electrical conductivity of the carbon shell.

PREPARING OF CORE SHELL COMPOSITE ACCORDING TO EXPERIMENTAL EXAMPLE 7-3

The same process was performed as described above in Experimental Example 7-2, but a ratio of copper precursors mixed with PVP was increased to prepare a preliminary composite including a copper core (diameter of 50 to 60 nm) and PVP surrounding the same.

After that, a core shell composite according to Experimental Example 7-3 was prepared by carrying out the same process as shown in Experimental Example 7-2.

FIG. 26 is a view showing a TEM picture for explaining a thickness of a carbon shell of a core shell composite according to Experimental Example 7-3 of the present invention.

Referring to FIG. 26, a thickness of a carbon shell of a core shell composite prepared as described above in Experimental Example 7-3 was measured. As can be understood from FIG. 26, the thickness of carbon shell was measured to be 5.27 nm. As described with reference to (b) of FIG. 25, if a diameter of a copper core is 100 nm in the core shell composite prepared according to Experimental Example 7-2, a thickness of the carbon shell was measured to be 2.32 to 2.84 nm. However, it can be confirmed that the thickness of the carbon shell is increased to be 5.27 nm, if a diameter of the copper core is decreased by increasing a ratio of copper precursors as describe above in Experimental Example 7-3. In other words, it can be confirmed that the thickness of the carbon shell is increased to be 5.27 nm from 2.32 to 2.84 nm, if the diameter of the copper core is decreased to 50 to 60 nm by increasing a ratio of copper precursors, compared to the case in which the diameter of the copper core is 100 nm. Consequently, it can be confirmed that decreasing the diameter of the copper core by increasing a mixing ratio of copper precursors in the preparing of the preliminary composite is an efficient method for increasing the thickness of the carbon shell.

Although the invention has been described in detail with reference to exemplary embodiments, the scope of the present invention is not limited to a specific embodiment and should be interpreted by the attached claims. In addition, those skilled in the art should understand that many modifications and variations are possible without departing from the scope of the present invention.

The technical spirit according to an embodiment of the present application may be utilized in various fields of industry requiring heat-radiating properties such as semiconductor devices, display devices, LED devices, light-receiving devices, automobiles, aircrafts, etc.

And, it is obvious that the technical idea and concept according to an embodiment of the present application can be applied to the advanced semiconductor packaging method such as embedded multi-die interconnect bridge (EMIB), integrated fan-out wafer level package (In-FOWLP), or Si interposer.

What is claimed is:

1. A method for manufacturing a semiconductor device package, the method comprising:
   providing a semiconductor device;
   preparing a thermal interface layer on the semiconductor device; and
   disposing a heat spreader on the thermal interface layer,
   wherein the thermal interface layer includes a core shell composite containing a metal core and a carbon shell surrounding the metal core, and
   wherein preparing the thermal interface layer includes:
      forming a thermal paste layer on the semiconductor device;
      preparing a first thermal interface layer including the core shell composite on the thermal paste layer;
      preparing a preliminary thermal interface layer including a metal-organic composite that contains a metal particle and an organic matter bonded onto a surface of the metal particle through a thiol group on the first thermal interface layer; and
      photo-sintering the preliminary thermal interface layer to prepare a second thermal interface layer.

2. The method of claim 1, wherein the metal core includes copper.

3. The method of claim 1, wherein photo-sintering the preliminary thermal interface layer includes:
   primarily photo-sintering the preliminary thermal interface layer to remove the organic matter from the metal-organic composite; and
   secondarily photo-sintering the primarily photo-sintered preliminary interface layer, so that the organic matter is removed from the metal-organic composite so as to form a metal thin film through sintering between residual metal particles.

4. The method of claim 3, wherein secondarily photo-sintering the primarily photo-sintered preliminary thermal interface layer is performed under a condition that optical energy applied to the primarily photo-sintered preliminary thermal interface layer is 18.7 J/mm or more.

5. The method of claim 1, wherein the metal particle of the metal-organic composite includes a metal which is a same type as the metal core of the core shell composite.

6. The method of claim 1,
   wherein the metal-organic composite is prepared by providing the metal particle and the organic matter into a reactor to bond a thiol group of the organic matter onto a surface of the metal particle, and
   wherein the organic matter includes at least one of butanethiol, octanethiol or decanethiol.

7. The method of claim 1, wherein preparing the thermal interface layer includes:
   providing a thermal interface material including the core shell composite and thermal grease; and
   providing the thermal interface material onto the semiconductor device to prepare the thermal interface layer.

8. The method of claim 1, further comprising preparing the core shell composite, wherein preparing the core shell composite includes:
   coating a pyrolytic polymer onto a surface of the metal particle to prepare a preliminary composite; and
   pyrolyzing the pyrolytic polymer of the preliminary composite to convert the pyrolytic polymer into the carbon shell.

9. A semiconductor device package comprising:
   a semiconductor device;
   a heat spreader; and
   a thermal interface layer including a thermal interface material between the semiconductor device and the heat spreader, wherein the thermal interface layer includes
      a core shell composite containing a metal core and a carbon shell surrounding the metal core,
      a thermal paste on the semiconductor device,
      a first thermal interface layer including the core shell composite on the thermal paste, and
      a second thermal interface layer including a metal identical to the core shell composite and the heat spreader, wherein the second thermal interface layer forms a metal thin film that interfaces with the core shell composite along a concave-convex boundary.

10. The semiconductor device package of claim 9, wherein the second thermal interface layer includes a metal particle which is melted and sintered.

11. The semiconductor device package of claim 9, wherein the thermal interface layer includes the core shell composite and thermal grease.

12. The semiconductor device package of claim 9, wherein the metal core includes copper.

* * * * *